United States Patent
Andrea et al.

(10) Patent No.: US 9,281,666 B2
(45) Date of Patent: Mar. 8, 2016

(54) SUBSEA ELECTRICAL DISTRIBUTION SYSTEM HAVING REDUNDANT CIRCUIT BREAKER CONTROL AND METHOD FOR PROVIDING SAME

(71) Applicant: Schneider Electric Industries SAS, Rueil-Malmaison (FR)

(72) Inventors: Pierrick Andrea, Seyssinet-Pariset (FR); Stephane Jacques Clement Papoz, Meylan (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 549 days.

(21) Appl. No.: 13/706,271

(22) Filed: Dec. 5, 2012

(65) Prior Publication Data

US 2013/0286547 A1    Oct. 31, 2013

Related U.S. Application Data

(60) Provisional application No. 61/639,865, filed on Apr. 28, 2012.

(51) Int. Cl.
| | |
|---|---|
| *H02B 7/00* | (2006.01) |
| *H02B 5/06* | (2006.01) |
| *H02B 1/22* | (2006.01) |
| *H01H 69/00* | (2006.01) |
| *H02B 1/26* | (2006.01) |

(Continued)

(52) U.S. Cl.
CPC ............... *H02B 7/00* (2013.01); *H01H 69/00* (2013.01); *H02B 1/01* (2013.01); *H02B 1/22* (2013.01); *H02B 1/26* (2013.01); *H02B 5/06* (2013.01); *H02J 13/0065* (2013.01); *H02J 3/36* (2013.01); *H02J 4/00* (2013.01); *Y02E 60/60* (2013.01)

(58) Field of Classification Search
CPC .............. H02B 7/00; H02B 1/26; H02B 1/01; H01H 69/00; H02J 13/0065; H02J 3/36; H02J 4/00; Y10T 29/49117; Y10T 29/49105; Y02E 60/60
USPC ........................................................ 307/113
See application file for complete search history.

(56) References Cited

U.S. PATENT DOCUMENTS

| | | | |
|---|---|---|---|
| 5,756,952 A * | 5/1998 | Thuries | 218/154 |
| 8,111,502 B2 | 2/2012 | Rocke | |

(Continued)

FOREIGN PATENT DOCUMENTS

| | | |
|---|---|---|
| WO | 2011/029566 | 3/2011 |
| WO | 2012/034984 | 3/2012 |

OTHER PUBLICATIONS

Henri Baerd, Ormen Lange Subsea Compression Station Pilot, 9 pp.

(Continued)

*Primary Examiner* — Thienvu Tran
*Assistant Examiner* — Kevin J Comber

(57) ABSTRACT

A system and method for coupling electrical power subsea. The system comprises a subsea electrical distribution system having at least one modular circuit breaker assembly. The modular circuit breaker assembly is controlled by a control system that has a plurality of circuit breaker controls. Each circuit breaker is operable to be controlled by a plurality of circuit breaker controls and each circuit breaker control is operable to control a plurality of circuit breakers. Therefore, control of each circuit breaker is maintained even if one circuit breaker control fails.

18 Claims, 16 Drawing Sheets

(51) Int. Cl.
*H02B 1/01* (2006.01)
*H02J 13/00* (2006.01)
*H02J 3/36* (2006.01)
*H02J 4/00* (2006.01)

(56) References Cited

U.S. PATENT DOCUMENTS

2011/0247825 A1* 10/2011 Batho et al. .................. 166/335
2012/0234796 A1* 9/2012 Juhlin .......................... 218/143
2012/0267955 A1* 10/2012 Zhan et al. ..................... 307/31

OTHER PUBLICATIONS

Terence Hazel, Impact of Subsea Processing Power Distribution: Subsea Switchgear Module, May 3-6, 2010, 14 pp., 2010 Offshore Technology Conference, Houston, TX.

Terence Hazel, Power Distribution for Arctic Subsea Tiebacks, Dec. 3-5, 2012, 8 pp., Arctic Technology Conference, Houston, TX.

Terence Hazel, Subsea High-Voltage Power Distribution, 9 pp.

Framo Subsea Power Distribution and Control Systems, Mar. 9, 2007, 6 pp., College Station, TX.

Dr. Stuart L. Scott, Rpsea Seafloor Technologies Forum, Mar. 9, 2007, 12 pp., College Station, TX.

J P. Kenny—A Global Perspective on the Future of Subsea Technology—SUT Subsea Technical Conference, Feb. 2009, 29 pp.

Offshore Technology Roadmap for the Ultra-Deepwater Gulf of Mexico, Nov. 2000, 72 pp., U.S. Department of Energy.

SpecTRON™ Medium & High Power Electrical Connector Systems, Expro Connectors and Measurements, 2008, 12 pp.

Peter Jones, The Challanges of Offshore Power System Construction—TrollA, Electrical Power Delivered Successfully to an Oil and Gas Platform in the North Sea, 4 pp.

Bernt Bjerkreim, Ormen Lange Subsea Compression Pilot, Apr. 30-May 3, 2007, 11 pp., Offshore Technology Conference, Houston, TX.

Tom Romanisko, Extending Tieback Distances: Wet-Mate Connectors, Enabling Technologies for Critical Systems Developments, Apr. 30-May 3, 2001, 9 pp., OTC Conference, Houston TX.

* cited by examiner

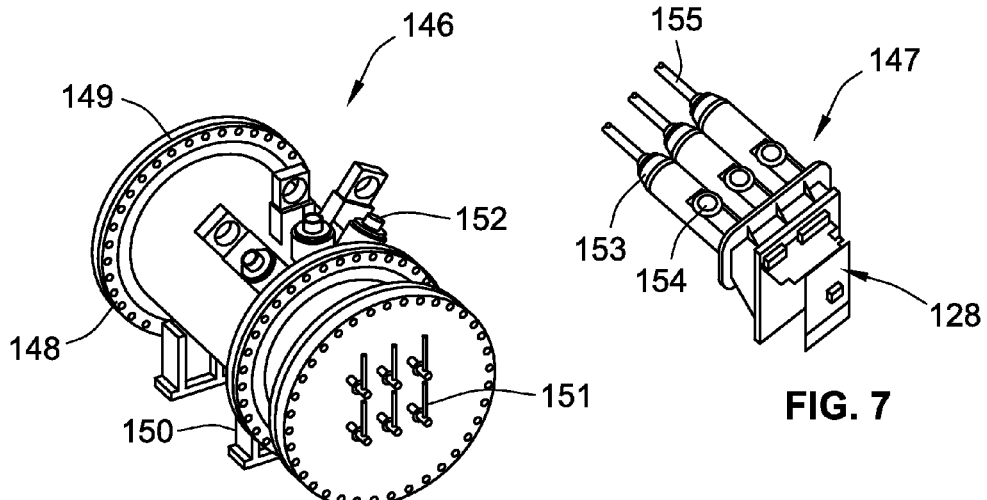
FIG. 6
FIG. 7
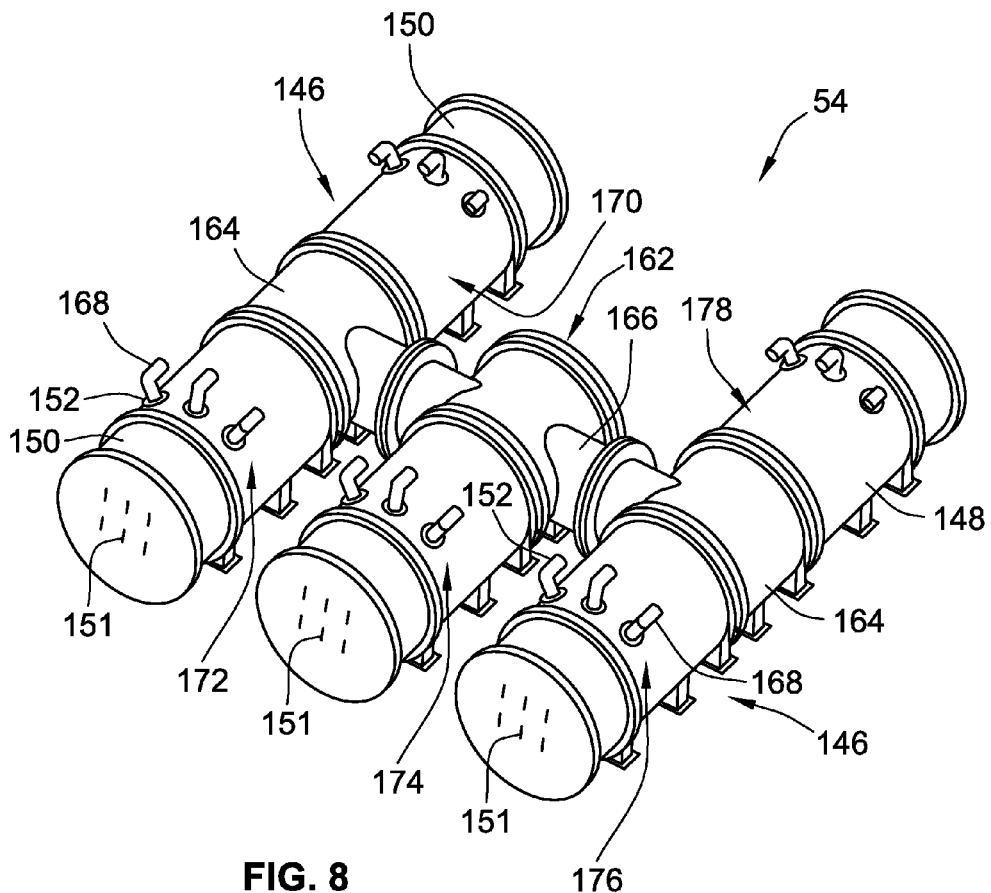
FIG. 8

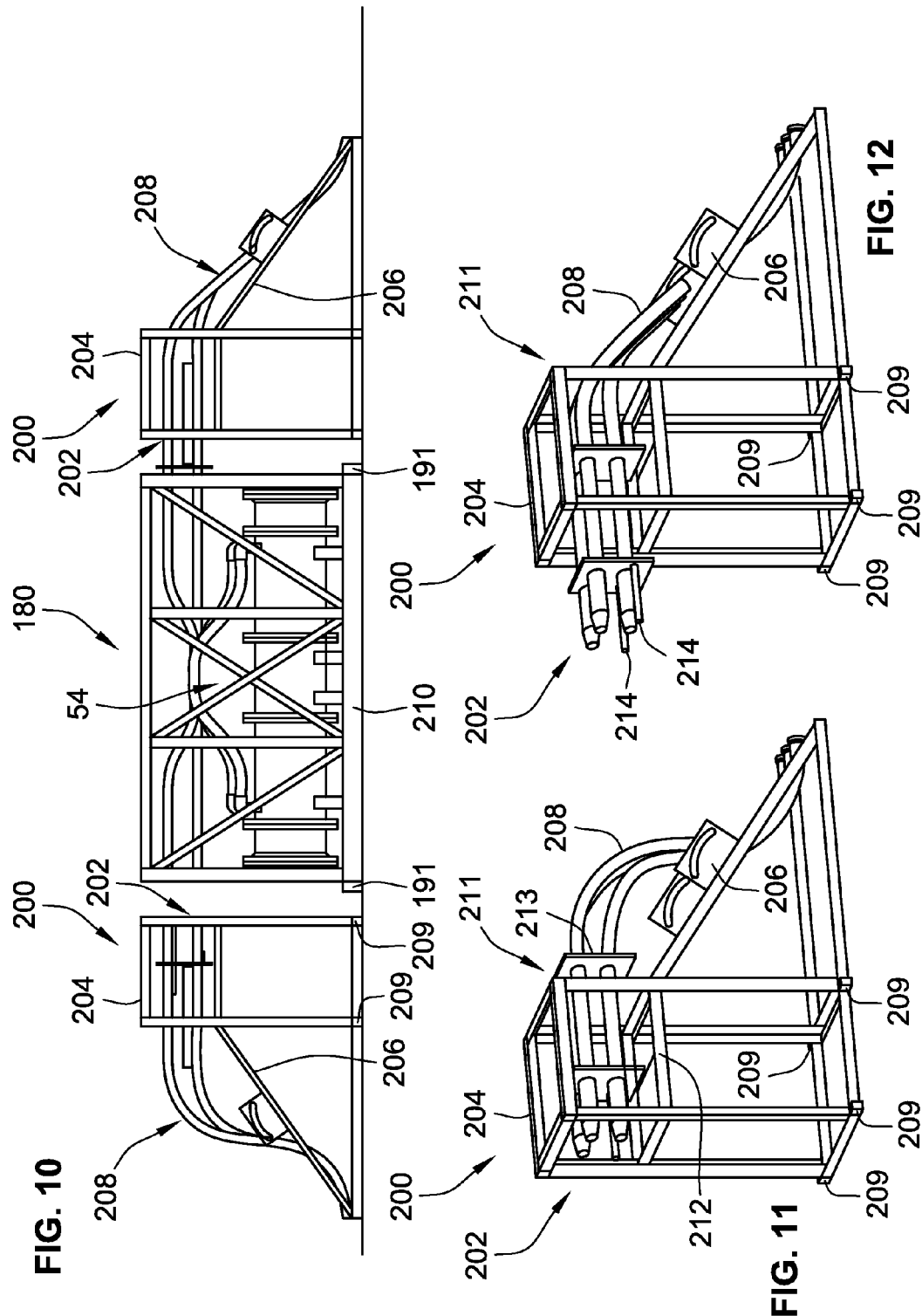

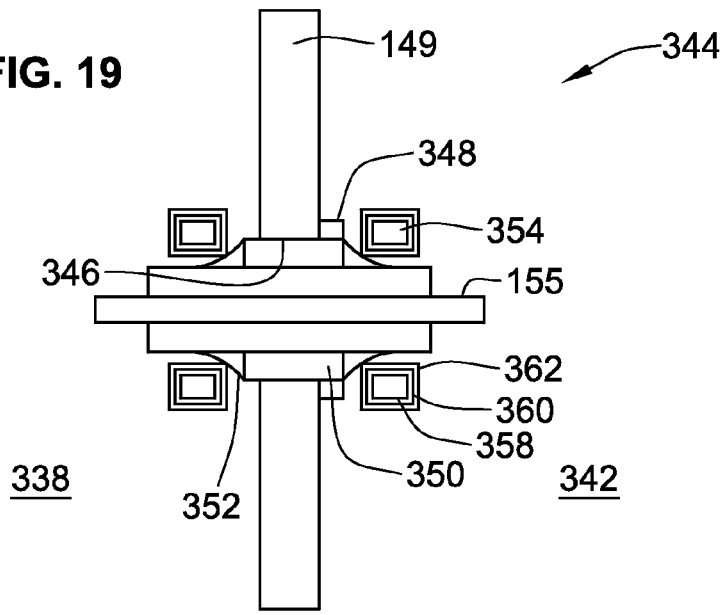
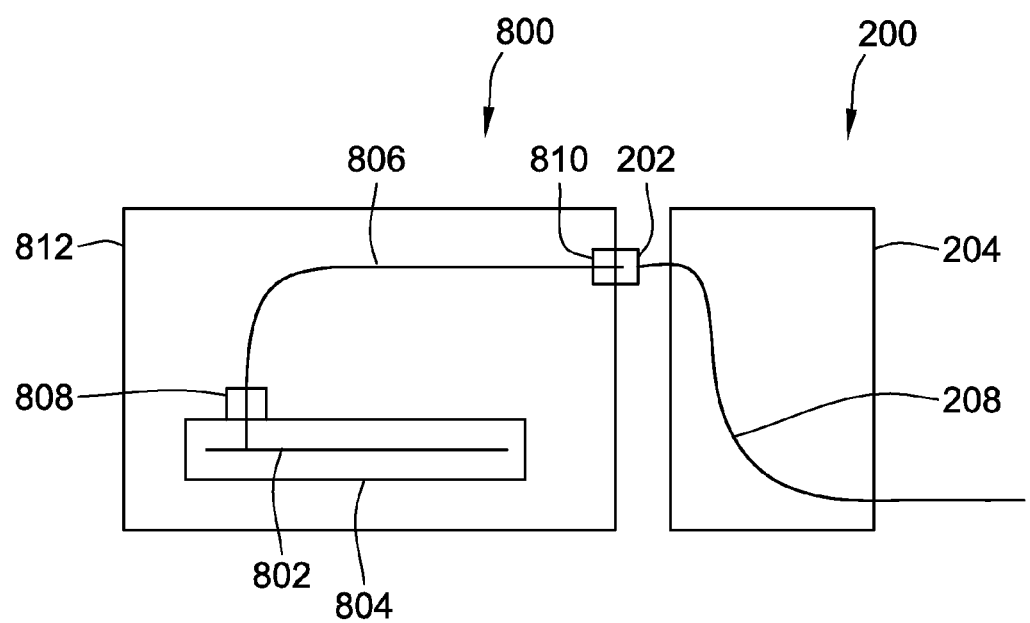

SUBSEA ELECTRICAL DISTRIBUTION SYSTEM HAVING REDUNDANT CIRCUIT BREAKER CONTROL AND METHOD FOR PROVIDING SAME

CROSS-REFERENCE TO RELATED APPLICATIONS

This application claims priority to Provisional patent application No. 61/639,865, filed on Apr. 28, 2012, which is hereby incorporated by reference in its entirety.

BACKGROUND

1. Field of the Invention

The present invention relates generally to subsea electrical systems and, more specifically, to a subsea electrical distribution system comprising a subsea circuit breaker.

2. Description of the Related Art

This section is intended to introduce the reader to aspects of art that may be related to aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

The petroleum industry has seen an increase in interest in the placement of pumping and/or processing equipment for fluids produced from subsea wells on the sea floor. Subsea pumping and processing system are particularly suited for challenging environments, such as the deep sea and Arctic, which are difficult to support from fixed platforms or floating production units. Subsea hydrocarbon production fields may comprise many subsea wells extending over hundreds of square miles. Therefore, subsea pumping and/or processing equipment may be required to be placed at several locations many miles apart.

Power for the subsea pumping and/or processing equipment must be supplied from a fixed platform, a floating production unit, or from land. Thus, power cables may be needed to cover extreme distances, possibly a hundred miles or more. The greater the number of pumping and/or processing units in a production field, the greater the number of power cables extending over these long distances are needed. Such systems are complicated and expensive.

SUMMARY OF THE INVENTION

A system and method for coupling electrical power subsea. The system comprises a subsea electrical distribution system having at least one modular circuit breaker assembly. The modular circuit breaker assembly is controlled by a control system that has a plurality of circuit breaker controls. Each circuit breaker is operable to be controlled by a plurality of circuit breaker controls and each circuit breaker control is operable to control a plurality of circuit breakers. Therefore, control of each circuit breaker is maintained even if a circuit breaker control fails. The system has extendable electrical connectors to facilitate connection of subsea electrical distribution system components.

BRIEF DESCRIPTION OF THE DRAWINGS

Advantages of the invention may become apparent upon reading the following detailed description and upon reference to the drawings in which:

FIGS. 6 and 7 are perspective views of a modular subsea circuit breaker assembly for a subsea electrical distribution system, in accordance with exemplary embodiments of the present techniques;

FIG. 8 is a perspective view of a modular subsea circuit breaker for a modular subsea electrical distribution system, in accordance with exemplary embodiments of the present techniques;

FIG. 10 is an elevation view of a modular subsea circuit breaker assembly and a pair of power cable harness assemblies having a retractable/extendable connector for a modular subsea electrical distribution system, in accordance with exemplary embodiments of the present techniques;

FIG. 11 is a perspective view of the power cable harness assembly of FIG. 10 with the retractable/extendable connector in the retracted position, in accordance with exemplary embodiments of the present techniques;

FIG. 12 is a perspective view of the power cable harness assembly of FIG. 10 with the retractable/extendable connector in the extended position, in accordance with exemplary embodiments of the present techniques;

FIG. 19 is an elevation view of a penetrator assembly for a modular circuit breaker assembly, in accordance with exemplary embodiments of the present techniques.

FIG. 22 is an elevation view of a modular subsea electrical distribution system, in accordance with an alternative embodiment of the present techniques.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill in the art and having the benefit of this disclosure.

Figure 1:
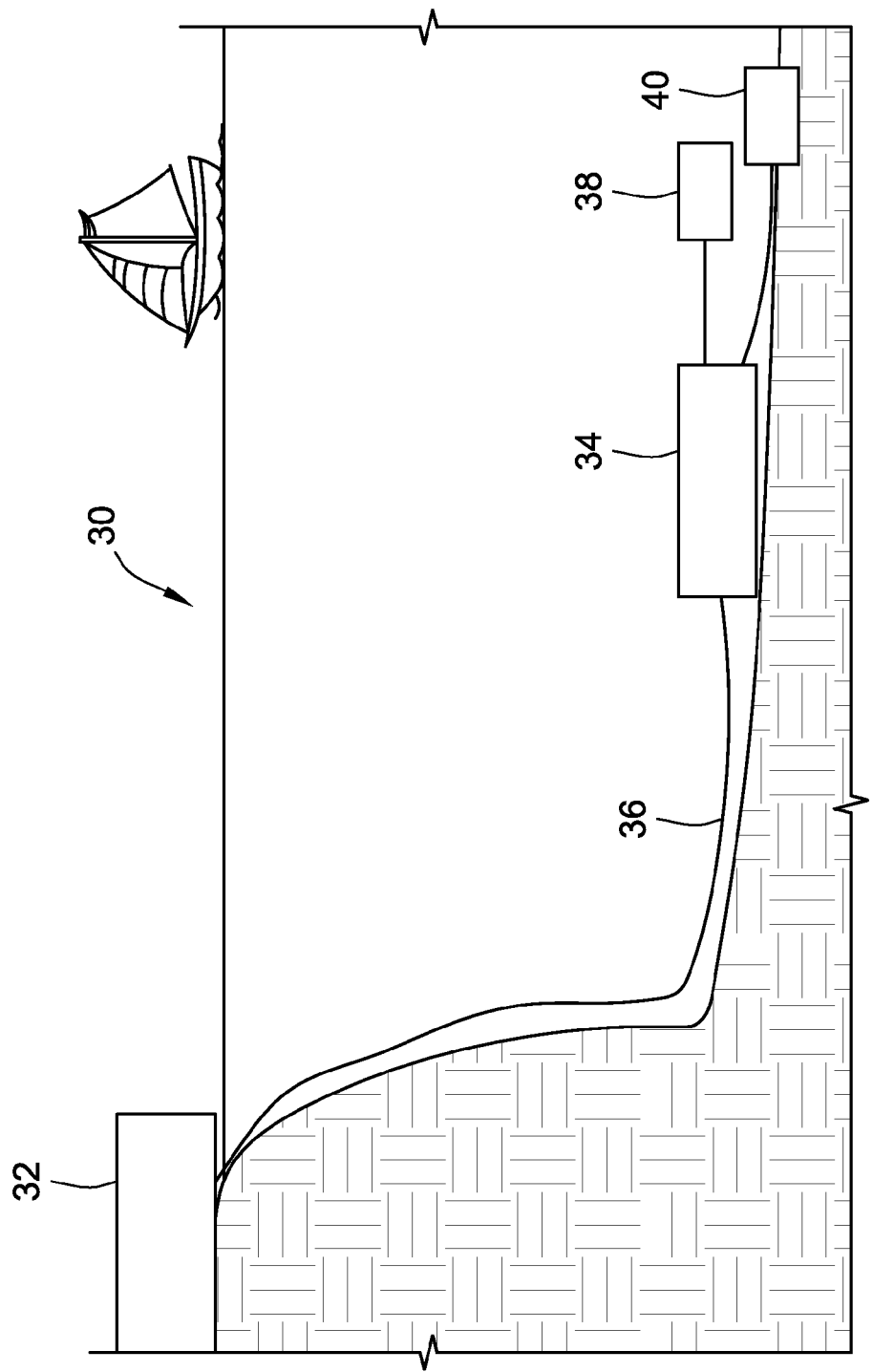
FIG. 1 is a schematic diagram of a subsea system, in accordance with exemplary embodiments of the present techniques.

Referring generally to FIG. 1, a system for providing electric power subsea is presented and referenced generally by reference numeral 30. In the illustrated embodiment, a surface facility 32 provides High voltage alternating current ("HV AC") electric power and control signals to a subsea electrical distribution system 34 via an umbilical cable 36. There is no set voltage value that defines what is "High voltage". However, in this embodiment, the voltage of HV AC provided by the umbilical is 110 kV AC or greater. In this embodiment, the surface facility 32 is located on land. However, the surface facility 32 may also be an off-shore platform or a vessel, such as a floating production and offloading ("FPO") vessel. As will be discussed in more detail below, the subsea electrical distribution system is a modular system that may be assembled in different configurations to meet system demands. In the illustrated embodiment, the subsea electrical distribution system 34 is configured to provide power to a first subsea load 38 and a second subsea load 40. The subsea electrical distribution system 34, as well as subsea loads 38, 40 may be located at extreme distances from the surface facility 32. For example, the subsea electrical distribution system 34 and subsea loads 38, 40 may be 150 km or more from the surface facility 32. In addition, the subsea electrical distribution system 34 and subsea loads 38, 40 may be located on an ocean floor several thousand feet below the surface of the ocean. Although only two subsea loads 38, 40 are shown in this embodiment, it is envisioned that many more subsea loads would receive power through the subsea electrical distribution system 34, rather than receiving power individually from the surface.

Figure 2:
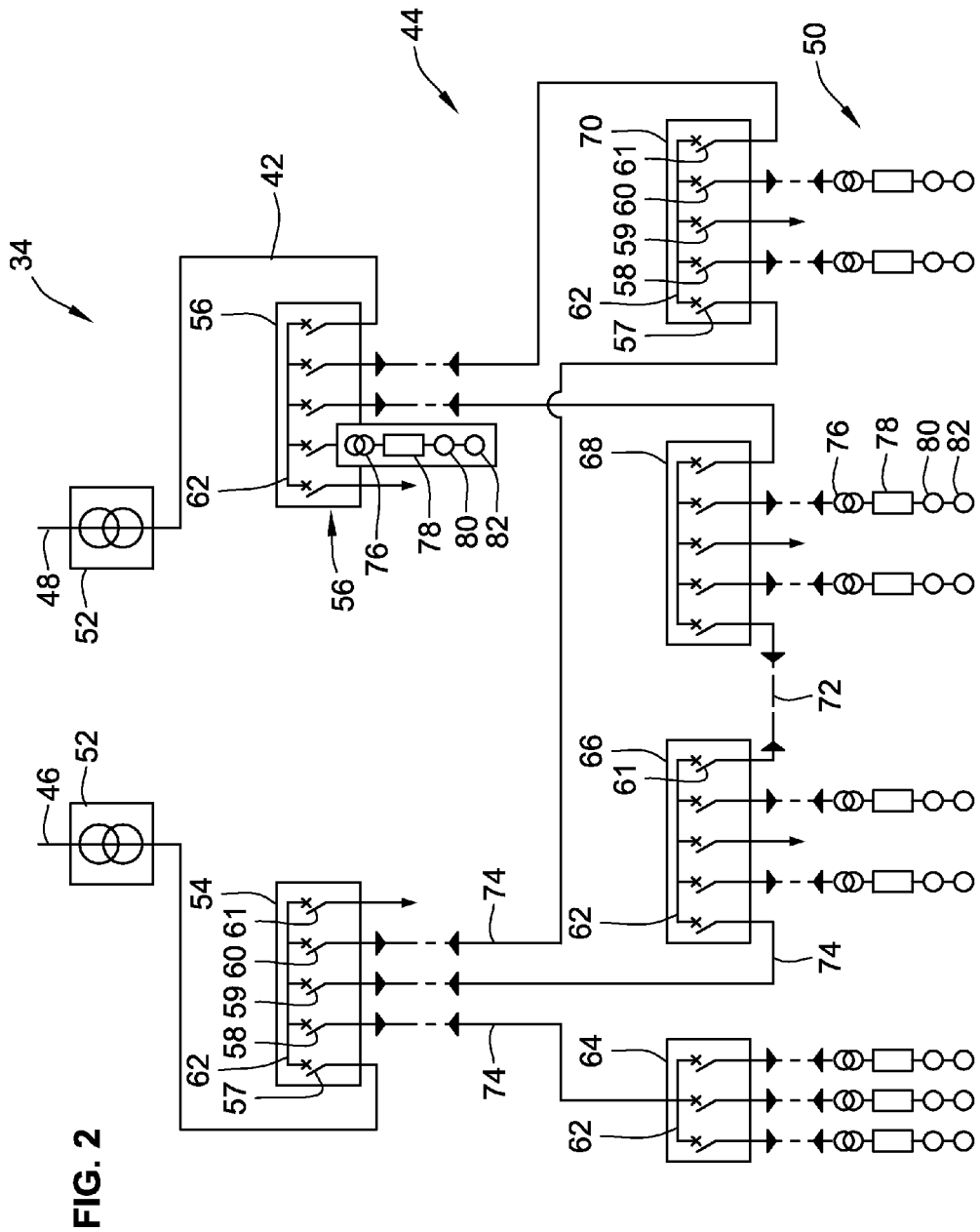
FIG. 2 is a schematic diagram of a modular subsea electrical distribution system, in accordance with an exemplary embodiment of the present techniques.

Referring generally to FIG. 2, the subsea electrical distribution system 34 is a modular system having a plurality of circuit breaker modules that may be connected together to form the system 34. The circuit breaker modules provide the system 44 with its modularity. The circuit breaker modules may be assembled and connected in a myriad of configurations to meet the demands of the subsea electrical distribution system 34. The circuit breaker modules are provided in the illustrated embodiment to enhance the flexibility and reliability of the subsea electrical distribution system 44.

In this embodiment, the subsea electrical distribution system 34 comprises a pair of central circuit breaker modules 42 that are configured to receive power and then distribute the power to a plurality of remote circuit breaker modules 44. The remote circuit breaker modules 44 may be located near the central circuit breaker modules 42 or at greater distances, such as tens of kilometers away. In this embodiment, the central circuit breaker modules 42 receive power from a first subsea umbilical 46 and a second subsea umbilical 48 for reliability. However, a single subsea umbilical may be used. As will be discussed in more detail below, the first and second subsea umbilicals 46, 48 comprise HV AC power cables, High voltage direct current ("HV DC") power cables, and fiber optic communication cables in this embodiment. As above, the HV AC carried by the umbilicals 46, 48 in this embodiment is 110 kV AC or greater. However, lower voltages may be provided. As with AC, there is no definitive DC voltage value that defines HV DC. In this embodiment, the HV DC carried by the umbilicals 46, 48 is between 2-10 kV DC. However, greater or lower DC voltages may be provided. The remote circuit breaker modules 44, in turn, are configured to provide power to a plurality of subsea electric loads 50. In the illustrated embodiment, the power received from the first umbilical 46 and a second umbilical 48 are reduced by a pair of subsea step-down transformers 52. However, power may be received at a lower voltage 36 kV), such that subsea step-down transformers are not required.

In this embodiment, the power received by the subsea electrical distribution system 34 is reduced by a pair of step-down transformers 52 before it is transmitted to the central circuit breaker modules 42. For example, the subsea transformers 52 may step-down the voltage of the HV AC electrical power from 110 kV AC to 36 kV AC. In this embodiment, the central circuit breaker modules 42 of the subsea electrical power distribution system 34 comprise a first circuit breaker module 54 and a second circuit breaker module 56. However, a single central circuit breaker module 42 may be used, particularly if only one umbilical is used. In this embodiment, the first circuit breaker module 54 receives power from the first umbilical 46 and the second circuit breaker module receives power from the second subsea umbilical 48. The first and second circuit breaker modules 54, 56 comprise a plurality of circuit breakers for selectively supplying electric power. The number of circuit breakers provided in each circuit breaker module may be varied depending upon the system requirements, such as the number of electrical loads to be supplied with power. In the illustrated embodiment, the first and second circuit breaker modules 54, 56 each comprise five circuit breaker assemblies 57, 58, 59, 60, 61. One side of each circuit breaker assembly 57, 58, 59, 60, 61 is connected to a common bus bar 62 and the other side of each circuit breaker assembly 57, 58, 59, 60, 61, the "free side", may be coupled to a power source or a load depending on the desired configuration. The first and second circuit breaker modules 54, 56 are configured in this embodiment so that the free side of circuit breaker assembly 57 receives power from one of the subsea umbilicals 46, 48. Power passes through circuit breaker assembly 57 to the bus bar 62. Circuit breaker assembly 57 is used to selectively connect and disconnect the bus bar 62 from power coming from one of the subsea umbilicals 46, 48. The free side of circuit breaker assemblies 58, 59, 60, and 61 of the first and second circuit breaker modules 54, 56 are either coupled to remote circuit breaker modules 44, loads, or not connected to anything for use as a spare.

The remote circuit breaker modules 44 comprise a third circuit breaker module 64 that comprises three circuit breaker assemblies 57, 58, 59, rather than five. In this configuration, the third circuit breaker module 64 is connected to the free side of circuit breaker assembly 58 of the first circuit breaker module 54. This enables power to be provided to the bus bar 62 of the third circuit breaker module 64 from the first circuit breaker module 54. The free sides of circuit breaker assemblies 57, 58, 59 of the third circuit breaker module 64 are coupled to loads 50. The three circuit breaker assemblies 57, 58, 59 of the third circuit breaker module 64, thus, are operable to selectively connect and disconnect the loads 50 and the bus bar 62 of the third circuit breaker module 64.

The remote circuit breaker modules 44 are configured to receive power from either subsea umbilical 46, 48. In this embodiment, the remote circuit breaker modules 44 also comprise a fourth circuit breaker module 66, a fifth circuit breaker module 68, and a sixth circuit breaker module 70. Circuit breaker assembly 57 of the fourth circuit breaker module 66 is coupled to circuit breaker assembly 59 of the first circuit breaker module 54. This enables power to be provided to the bus bar 62 of the fourth circuit breaker module 66 from the first subsea umbilical 46 via circuit breaker 57 of the fourth circuit breaker module 66. In addition, circuit breaker assembly 61 of the fourth circuit breaker module is connected by a link 72 to circuit breaker assembly 57 of the fifth circuit breaker module 68. Circuit breaker assembly 61 of the fifth circuit breaker module 68 is coupled to circuit breaker assembly 59 of the second circuit breaker 58. This enables power to be provided to the bus bar 62 of the fifth circuit breaker module 68 from the second subsea umbilical 48 via circuit breaker assembly 61 of the fifth circuit breaker module 68. Thus, by selectively operating circuit breaker assembly 57 of the fourth circuit breaker module 66 and circuit breaker assembly 61 of the fifth circuit breaker module 68, power may be provided to bus bars 62 of the fourth and fifth circuit breaker modules 66, 68 from either the first subsea umbilical 46 or the second subsea umbilical 48. Alternatively, the sixth circuit breaker module 70 is coupled to both the first and second circuit breaker modules. By selectively operating circuit breaker assembly 57 and circuit breaker assembly 61 of the sixth circuit breaker module 70, power may be supplied to the bus bar of the sixth circuit breaker module 70 from either the first umbilical 46 or the second umbilical 48 via the first and second circuit breaker modules 54, 56.

The subsea electrical distribution system 44 may be used to provide power to a variety of loads 50, rather than routing power directly to each load 50 from the surface. This greatly simplifies power distribution. In this embodiment, each of the loads 50 comprises an additional step-down transformer 76 to supply power to a variable speed drive ("VSD") 78. The VSD 78 provides variable speed electric power to a motor 80 to drive a pump 82. Similarly, a load 50 may be a variable frequency drive ("VFD"). The pumps 82 may be used to pump fluids from a subsea well to a processing unit, for example. However, the VSDs may be used to drive subsea compressors, as well.

Figure 3:
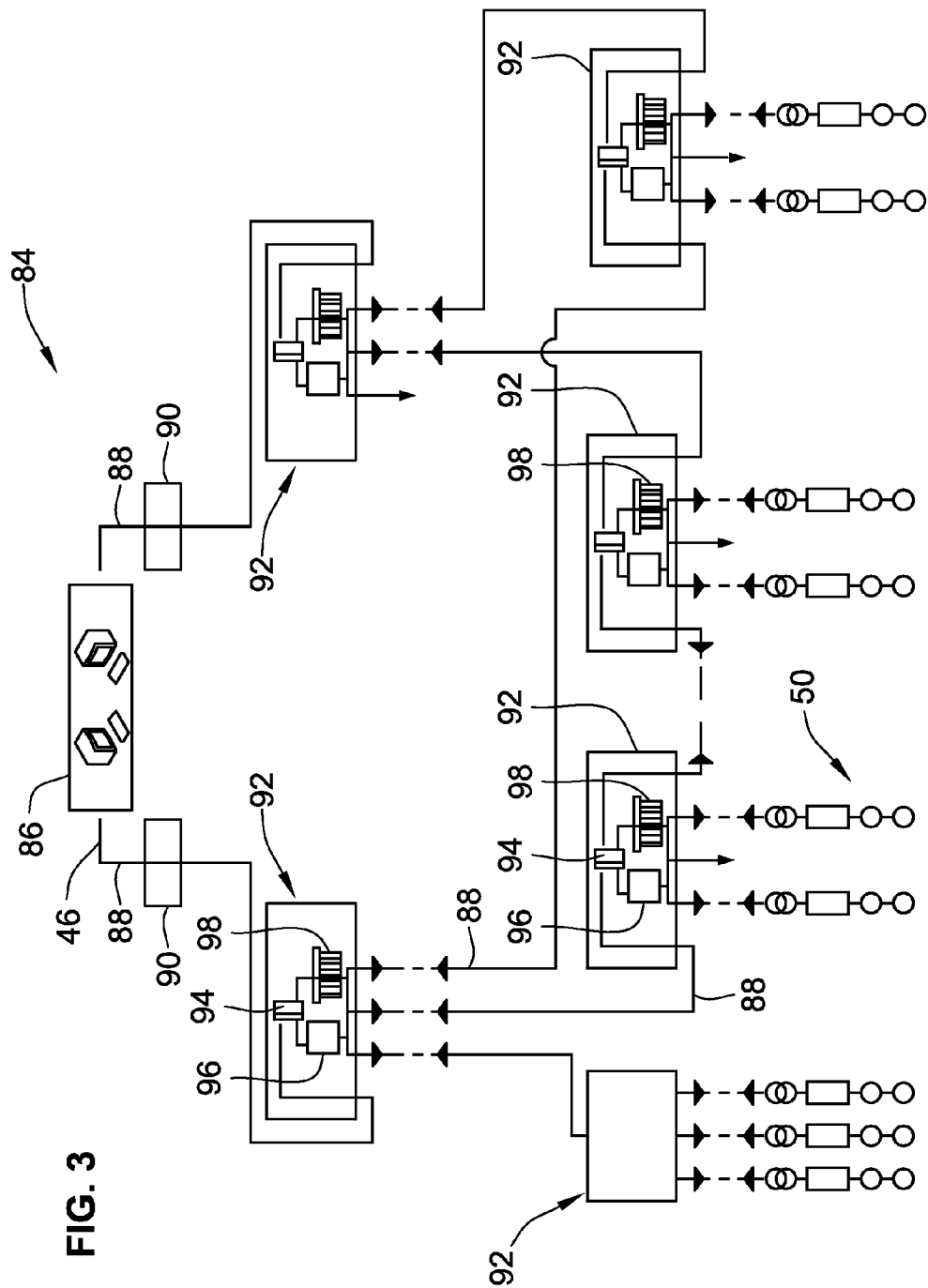
FIG. 3 is a schematic diagram of a control and monitoring system for the modular subsea electrical distribution system of FIG. 2, in accordance with exemplary embodiments of the present techniques.

Referring generally to FIG. 3, operation of the subsea electrical distribution system 34 is controlled by a control and monitoring system 84. In the illustrated embodiment, a computer system 86 is used to enable a user to manage the subsea electrical distribution system 34 via the control and monitoring system's HMI (Human Machine Interface). The computer system 86 may be located on-shore or at sea aboard a platform or vessel. The computer 86 may be used to transmit the user's close and open circuit breaker orders, automatically vary the speed of the VSDs, and perform other control functions. In addition, sensors may be coupled to the computer system 86 to provide the user with information to facilitate operation of the subsea electrical distribution system 34 and loads 50.

In the illustrated embodiment, the subsea umbilicals 46, 48 also include communication lines 88, which enable communication between the computer system 86, the subsea electrical distribution system 34 and loads 50. Preferably, the communication lines 88 are fiber optic cables routed along with HV AC and DC power cables in the umbilicals 46, 48. The umbilicals 46, 48, are terminated at a subsea umbilical termination assembly ("SUTA") 90 in this embodiment. From each SUTA 90, communication lines 88 are routed to protection and control modules 92 corresponding to each of the circuit breaker modules 54, 56, 64, 66, 68, 70. Each of the protection and control modules 92 has an Ethernet switch 94 that receives the fiber optic lines 88 in the illustrated embodiment. In the illustrated embodiment, the communication is based on use of functionality described IEC 61850. Reports are used to transmit information to the user for monitoring purposes. Control functions are executed by means of Generic Object Oriented Substation Events (GOOSE). GOOSE messages are also used for protection where communication between protection relays is required such as for subsea cables 72, 74. The use of IEC 61850 allows all communication required for protection, control and monitoring to transit via the fiber optic cables installed within the umbilicals and subsea cables. This avoids having to install additional cables for protection, monitoring and control.

In addition, each protection and control module 92 comprises a protection relay 96 and one or more programmable logic controller functions (PLCs) 98. In addition to the protection functions, the protection relay 96 also comprises monitoring equipment for the subsea electrical distribution system 34, such as circuit breaker conditions, and the plurality of loads 50. The PLC functions 98 are used to control the circuit breaker assemblies 58, 60. The protection relay 96 is operable to provide a signal to the PLC functions 98 to trip the circuit breakers when an undesired condition is reached, such as an overload condition. The protection relay provides direct tripping of the circuit breaker for electrical faults. The Ethernet switch 94 routes communications between the computer system 86, the protection relay 96, and the PLC functions 98. The PLC functions can be housed in discrete pieces of equipment or can be integrated into another electronic device such as a protection relay. The "PLC" function can have different embodiments.

Figure 4:
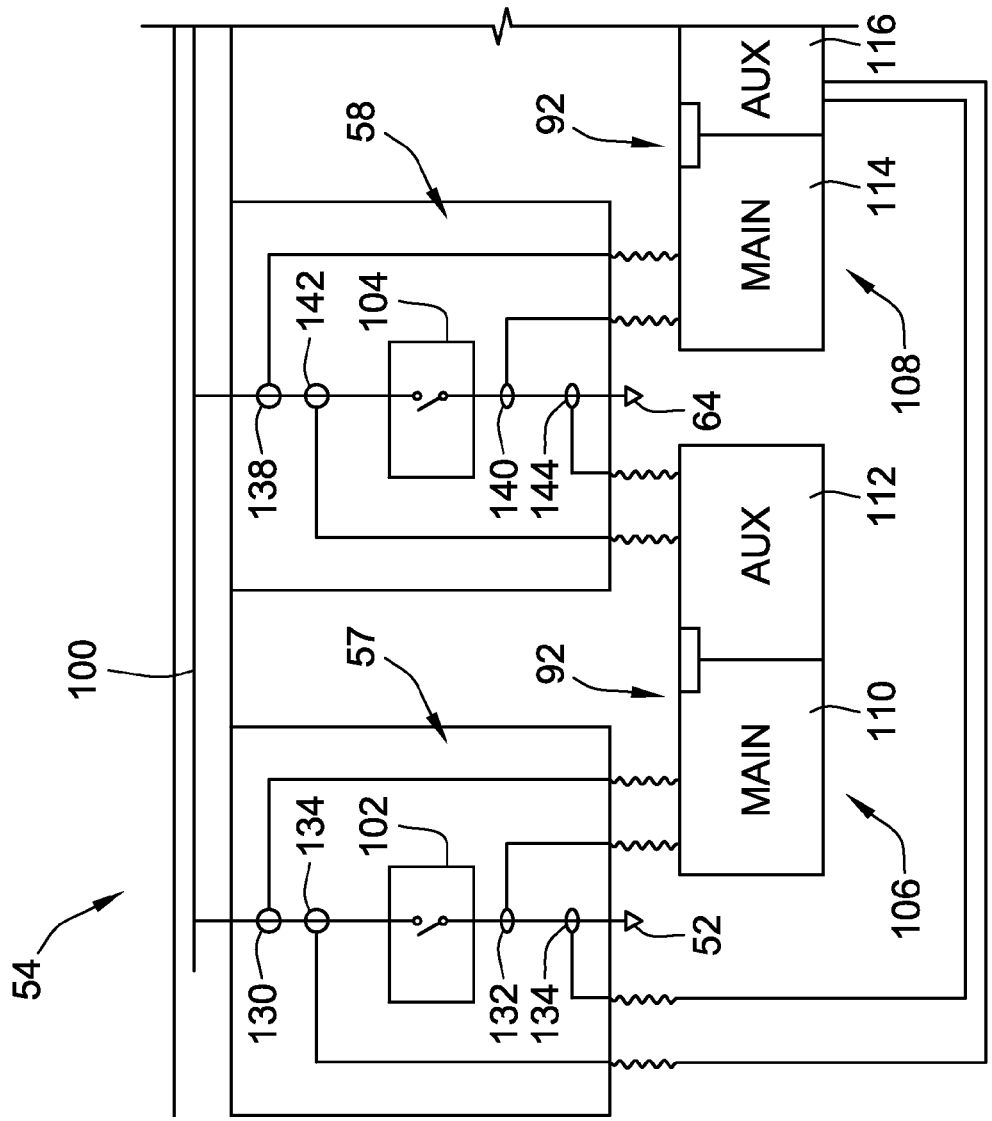
FIG. 4 is a block diagram of a subsea circuit breaker and redundant control and monitoring equipment for a modular subsea electrical distribution system, in accordance with exemplary embodiments of the present techniques.
Figure 5:
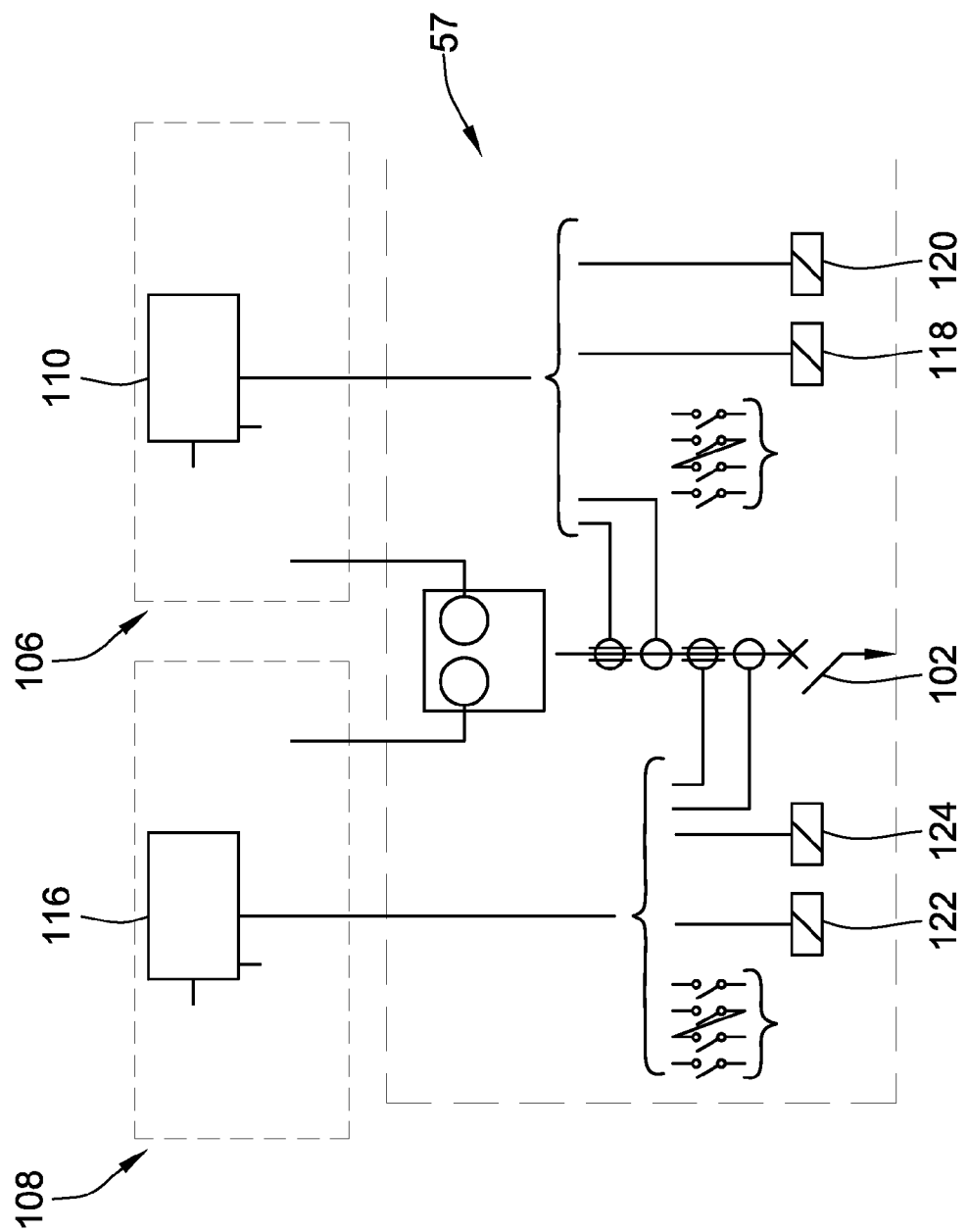
FIG. 5 is a schematic diagram of a subsea circuit breaker and redundant control and monitoring equipment for a modular subsea electrical distribution system, in accordance with exemplary embodiments of the present techniques.

Referring generally to FIGS. 4 and 5, detailed views of the first circuit breaker module 54 and its corresponding protection and control module 92 are presented. Circuit breakers assembly 57 comprises a circuit breaker 102. Similarly, circuit breaker assembly 58 comprises a circuit breaker 104. In the illustrated embodiment, each of the circuit breakers assemblies 57, 58 is connected to two protection and control modules 92 for redundant protection: a first control unit 106 and a second control unit 108. The first control unit 106 and second control unit 108 are operable to selectively open and close circuit breakers 102, 104. If one control unit 106, 108 fails, the other control unit 108, 106 can still selectively open and close both circuit breakers 102, 104. Each protection and control module 92 has a main relay and an auxiliary relay function that control the opening and closing of circuit breakers 102, 104. For example, the first control unit 106 has a main relay function 110 and an auxiliary relay function 112. Similarly, the second control unit 108 has a main relay function 114 and an auxiliary relay function 116. The main relay function of a control unit is connected to one circuit breaker, while the auxiliary relay function is connected to a second circuit breaker. For example, main relay function 110 of the first control unit 106 is connected to circuit breaker 102 and the auxiliary relay 112 is connected to circuit breaker 104. Similarly, circuit breaker 104 is connected to the main relay function 110 of control unit 106 and the auxiliary relay function 116 of control unit 108. If control unit 106 fails, circuit breaker 102 can still be controlled by auxiliary relay function 116 of control unit 108. In the illustrated embodiment the main relay function and the auxiliary relay function are housed in the same piece of equipment, known as a control unit.

As best illustrated in FIG. 5, circuit breakers are opened and closed by closing coils and trip coils, respectively. Each circuit breaker assembly has a spring-charged mechanism for opening and closing the circuit breaker and the circuit breaker closing coils and trip coils control the spring-charged mechanism. If a circuit breaker is open and the closing coil is energized, the spring-charged mechanism will close the circuit breaker. Similarly, when the circuit breaker is closed and the trip coil is energized, the spring-charged mechanism will open the circuit breaker. In the illustrated embodiment, each circuit breaker has redundant trip coils and closing coils. Surface circuit breakers have only a single closing coil. However, because of the difficulty in removing a circuit breaker module from subsea if the closing coil were to fail, two closing coils are provided in each circuit breaker in this embodiment. Circuit breaker assembly 57 has a first trip coil 118 and a first closing coil 120 that are connected to the main relay function 110 of control unit 106. In addition, circuit breaker assembly 57 has a second trip coil 122 and a second closing coil 124 that are connected to the auxiliary relay function 116 of the second control unit 108. Either trip coil 118, 122 can open the circuit breaker 102 and either closing coil 120, 124 can close the circuit breaker 102. A first electric motor 126 and a second electric motor 127 having separate power supplies are provided to energize the spring-charged mechanism 128 when the spring is discharged. A surface circuit breaker has only a single motor 126. However, because of the difficulty in repairing/replacing a subsea circuit breaker if the motor 126 fails, motors 126, 127 with separate power supplies are provided for reliability in this embodiment.

Referring generally to FIGS. 4 and 5, the protection and control modules 92 also are connected to sensors within the circuit breaker assemblies 57, 58. For example, the main relay function 110 of the first control unit 106 is connected to a first set of phase current sensors 130 and a first zero-sequence current sensor 132. The auxiliary relay function 114 of the second control unit 108 is connected to a second set of phase current sensors 134 and a second zero-sequence current sensor 136. Similarly, the main relay function 114 of the second control unit 108 is connected to a first set of phase current sensors 138 and a first zero-sequence current sensor 140 associated with the second circuit breaker assembly 58. The auxiliary relay function 112 of the first control unit 106 is connected to a second set of phase current sensors 142 and a second zero-sequence current sensor 144 associated with the second circuit breaker 58.

Referring generally to FIGS. 6 and 7, an embodiment of a modular subsea circuit breaker assembly 146 for housing a circuit breaker assembly 147 for use in the subsea electrical distribution system 34 of FIGS. 1-5 is presented. The circuit breaker assembly 147 is housed within a water-tight enclosure 148. The enclosure 148 protects the internal components from seawater. One end of the enclosure 148 has a gas sealing barrier 149 and the other end has a circuit breaker operating mechanism enclosure 150. The circuit breaker operating mechanism enclosure 150 has a series of connections 151 for connection to the control and monitoring system 84. In addition, the enclosure 148 has three sealed openings 152 called "penetrators" to which each phase of a three-phase power cable may be connected for connection to the circuit breaker assembly 147. In addition, in this embodiment, the enclosure 148 is filled with sulfur hexafluoride ($SF_6$) gas to a pressure of two atmospheres for electrical insulation between the circuit breaker assembly 147 and the enclosure 148.

In the illustrated embodiment, the circuit breaker assembly 147 is a three-phase circuit breaker. Each phase of the three-phase power has its own circuit breaker pole 153. Within each circuit breaker pole 153 is $SF_6$ gas to quench arcing between contacts when opening and closing the circuit breakers due to the large voltages utilized in the subsea electrical distribution system 34. A circuit breaker pole using vacuum for arc quenching can also be used. External electrical power cables are connected to the penetrators 152 on the enclosure 148 for internal connection to three terminals 154 on the circuit breaker assembly 147. Each circuit breaker pole 153 has a conductor 155 that extends through the gas sealing barrier 149 of the enclosure 148 into a bus bar compartment to which the modular circuit breaker assembly 146 is secured.

Referring generally to FIG. 8, an embodiment of the first circuit breaker module 54 is presented. In this embodiment, the first circuit breaker module 54 comprises five modular circuit breaker assemblies 146 connected to a bus bar assembly 162 housing the bus bar 59 (not shown). The bus bar assembly 162 is comprised of two end assemblies 164 connected to a central assembly 166. However, additional central assemblies 164 may be connected together to extend the bus bar assembly 162. The interior of the bus bar assembly 162 is insulated with $SF_6$ gas in this embodiment. As will be discussed in more detail below, the use of $SF_6$ gas for insulation, rather than oil, enables a smaller bus bar assembly 162 to be used, as well as requiring fewer penetrations through barriers that have to withstand differential pressure. Each of the modular circuit breaker assemblies 146 has a connector 168 for connecting to a power cable. Each of the connectors 168 is connected to a penetrator 152 which seals the opening in the enclosure 148.

In the illustrated embodiment, the first circuit breaker module 54 comprises a first modular circuit breaker assembly 170, a second modular circuit breaker assembly 172, a third modular circuit breaker assembly 174, a fourth modular circuit breaker assembly 176, and a fifth modular circuit breaker assembly 178. In this embodiment, circuit breaker 57 (not shown) is housed within the first modular circuit breaker assembly 170. Circuit breaker 58 (not shown) is housed within the second modular circuit breaker assembly 172. Circuit breaker 59 (not shown) is housed within the third modular circuit breaker assembly 174. Circuit breaker 60 (not shown) is housed within the fourth modular circuit breaker assembly 174. Finally, circuit breaker 61 (not shown) is housed within the fifth modular circuit breaker assembly 176. Opposite the third modular circuit breaker assembly 174 is a spare space for an additional modular circuit breaker assembly. This would bring the total number of circuit breakers to six if this spare space was used.

Figure 9:
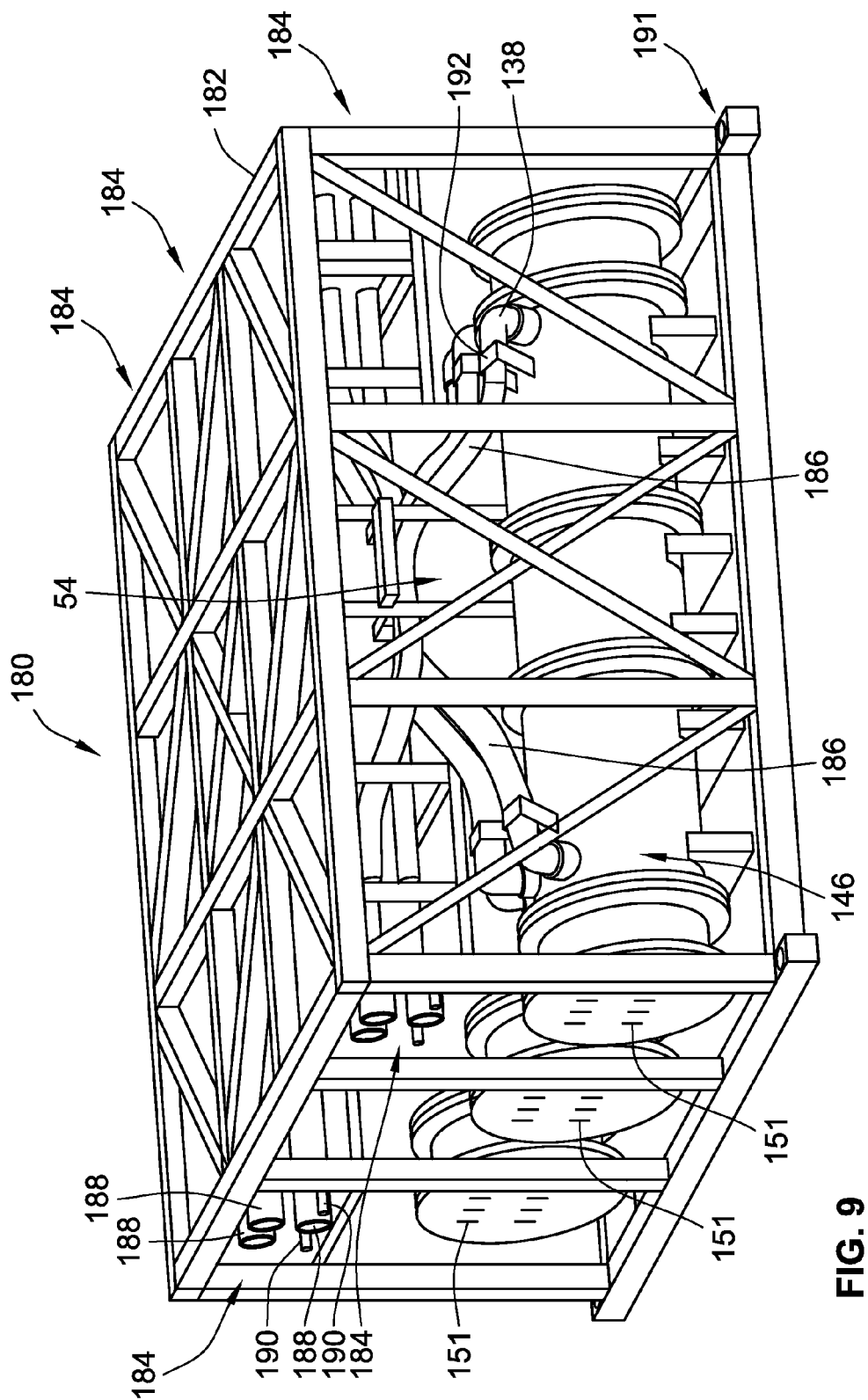
FIG. 9 is a perspective view of a modular subsea circuit breaker assembly for a modular subsea electrical distribution system, in accordance with exemplary embodiments of the present techniques.

Referring generally to FIG. 9, the first circuit breaker module 54 is housed within a supporting structure 180 in the illustrated embodiment. The supporting structure 180 comprises a frame 182 in which the first circuit breaker module 54 is supported. In addition, the supporting structure 180 is adapted to route power to and from each of the modular circuit breaker assemblies 146 of the first circuit breaker module 54. The first circuit breaker module 54 is configured by routing power either to or from each modular circuit breaker assembly 146. Connector assemblies 184 are disposed around the frame 182. The supporting structure 180 also comprises a plurality of power cables 186 that extend between the connector assemblies 184 and the connectors 168 on the circuit breaker assemblies 170, 172, 174, 176, 178 to route power to and from the modular circuit breaker assemblies 170, 172, 174, 176, 178. Each connector assembly 184 is configured with three wet mate power connectors 188 together with alignment guides 190. The alignment guides 190 align the power connectors 188 with a corresponding external wet mate connector assembly (not shown). Each power cable 186 is routed between a wet mate power connector 188 and a wet mate connector 168 on a circuit breaker assembly 170, 172, 174, 176, 178 in this embodiment. In addition, the supporting structure 180 has a plurality of guides 191 for alignment purposes. A cable clamp 192 is mounted on the circuit breaker module to support the cable at its connection 168. The clamp 192 is designed to securely hold the cable at varying external pressures from sea level to the final installation depth under water.

Referring generally to FIGS. 10-12, in the illustrated embodiment, each circuit breaker assembly 170, 172, 174, 176, 178 is connected to an external component of the subsea electrical distribution network via a subsea cable 208 by connecting a cable harness assembly 200 having a set of wet mate connectors 202 that may be extended and retracted to that modular circuit breaker assembly's connector assembly 184. The connector 202 of FIG. 11 and the left side of FIG. 10 is shown in the retracted position. The connector 202 of FIG. 12 and the right side of FIG. 10 is shown in the extended position. In this embodiment, the cable harness assembly 200 also comprises a frame 204, and a cable harness 206 for securing power cables 208 to the cable harness assembly 200. The frame 204 has a plurality of guides 209 for alignment purposes.

To connect the power cables 208 of the cable harness assembly 200 to the circuit breaker module assembly 180, the frame 204 of the cable harness assembly 200 is disposed adjacent to the frame 182 of the circuit breaker module assembly 180 so that the connector 202 is generally aligned with, and proximate to, the connector assembly 184. In this embodiment, the frame 182 of the circuit breaker module assembly 180 and the frames 204 of the cable harness assemblies 200 are disposed on a template 210. The template 210 has guideposts (not shown) configured to receive the guides 191 in the frame 182 of the supporting structure 180 and the guides 209 of the cable harness assemblies 200 so that the cable harness assemblies 200 and supporting structure 180 are in proper alignment. Each cable harness assembly is independent of the frame 182 and all other cable harnesses.

An ROV (not shown) is used to extend the connector 202 towards the connector assembly 184 of the circuit breaker module 180 to make the connection. The cable harness assemblies 200 have a connector guide assembly 211 comprising a fixed portion 212 secured to the frame 204 and a movable portion 213 secured to the power cables 208. The ROV (not shown) may secure to the frame 204 and grab the movable portion 213 and either pull or push the movable portion 213, and power cables 208, relative to the frame to retract or extend the connectors 202. As the connector 200 is extended, guide pins 214 on the connector 200 engage the guides 190 on the connector assembly 184 of the circuit breaker module assembly 180. The engagement between the guide pins 214 and the guides 190 brings the wet mate connectors 214 of the connector 200 into alignment with wet mate connectors 188 of the first circuit breaker module 54. Eventually, as the connector 202 is extended, the connectors 214 of the connector 202 of the cable harness assembly 200 connect to the connectors 188 of the first circuit breaker module assembly 54, electrically coupling the power cables 208 to the cables 186 of the supporting structure 180 of the first circuit breaker module assembly 54. Similarly, to disconnect the power cables 208 of the cable harness assembly 200 from the circuit breaker module assembly 180, an ROV (not shown) is used to retract the connector 202 to disengage from the connector assembly 184 of the supporting structure 180 of the first circuit breaker module 54.

Figure 13:
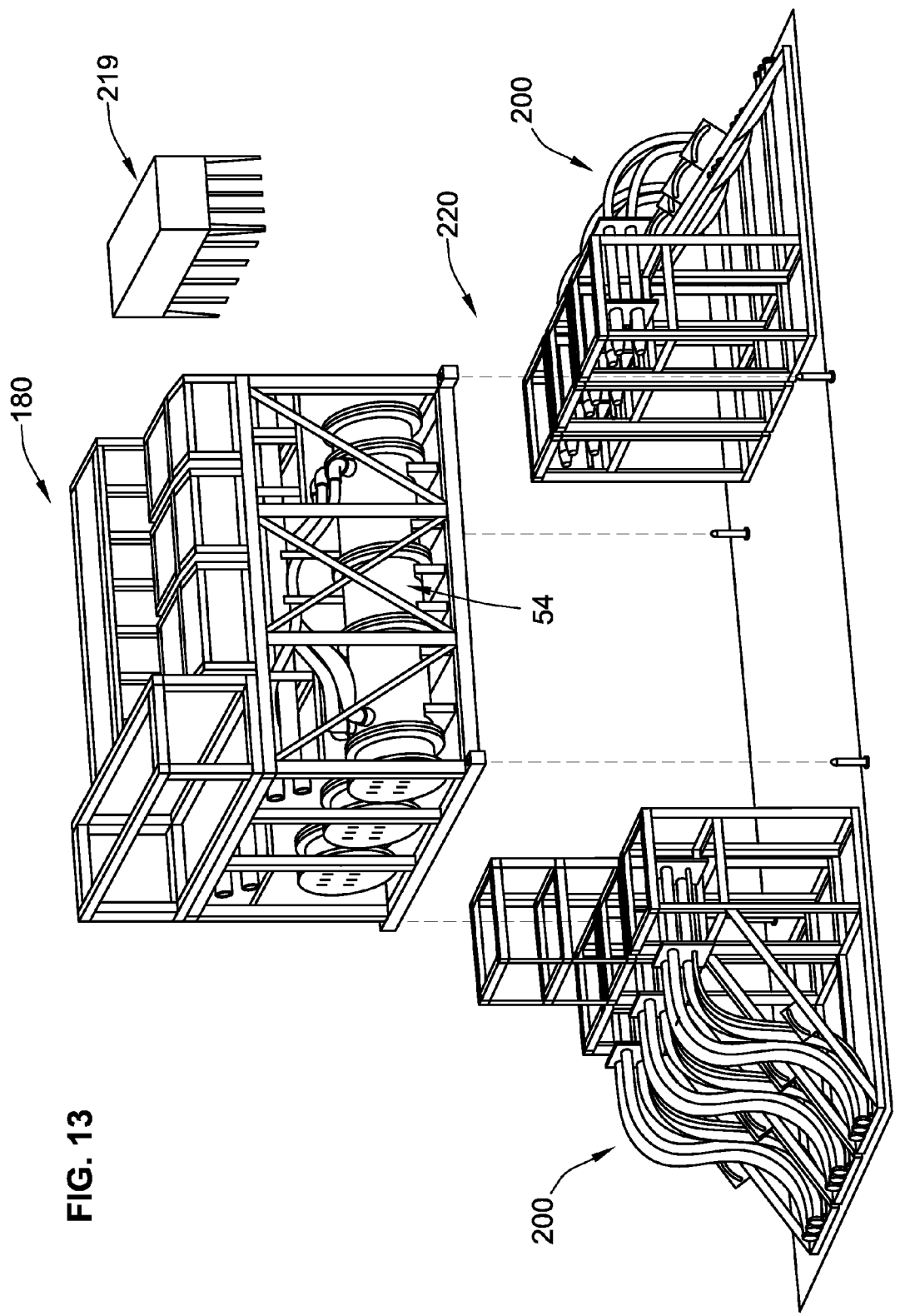
FIG. 13 is a perspective view of the modular subsea circuit breaker assembly of FIG. 10 being removed and lifted from the modular subsea electrical distribution system, in accordance with exemplary embodiments of the present techniques.

Referring generally to FIG. 13, because the cable harness assemblies 200 are selectively connectable to the supporting structure 180, a circuit breaker module assembly 180 may be removed from the subsea electrical distribution system 34 for repair/modification without requiring removal of loads 50 or other cables 208 routed to and from the circuit breaker modules. In this view, the circuit breaker module and supporting structure 180 are guided into and out of position by an ROV 219 on to the template 210. In addition, the cable harness assemblies 200 may be disconnected to facilitate fault detection. For example, after a connector 202 has been disconnected, an ROV may connect to the connectors 202 to perform test to identify if a fault exists in the power cable 208 or if the fault exists in the circuit breaker module 54. Alternatively, the ROV can check power cable electrical characteristics.

Figure 14:
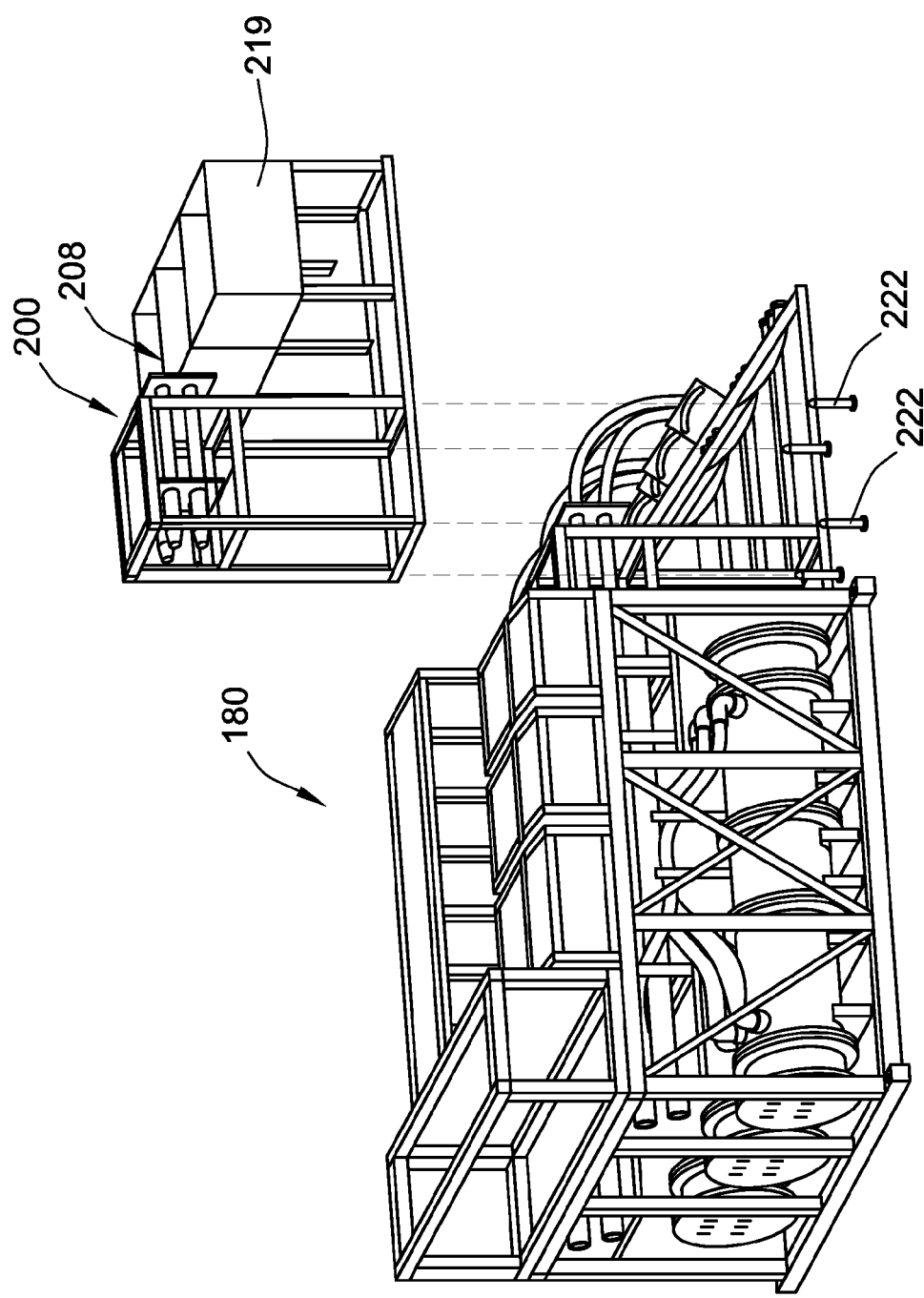
FIG. 14 is a perspective view of the power cable harness assembly of FIG. 10 and an electrical load being removed and lifted from the modular subsea electrical distribution system, in accordance with exemplary embodiments of the present techniques.

Referring generally to FIG. 14, similarly, a cable harness assembly 200 and connected cable 208 (not shown) may be removed from the subsea electrical distribution system 34 for repair/modification without requiring removal of the first circuit breaker module assembly 54 or other cables 208 routed to and from the circuit breaker module. To remove a cable harness assembly 200 from the subsea electrical distribution system 34, the retractable/extendable connector 202 for its cable harness assembly 200 is retracted; this disconnects the cable harness assembly 200 and connected cable 208 from the circuit breaker module assembly 180. The cable harness assembly 200, and the cables 208 connected to the cable harness assembly 200 may then be raised to the surface for repair/modification. The cable harness assembly 200 is guided into and out of position by the ROV onto the template 210. If the load 50 remains connected to the cable 208 then it may be raised to the surface for repair/modification together with the cable harness assembly 200 and connected cable 208.

Figure 15:
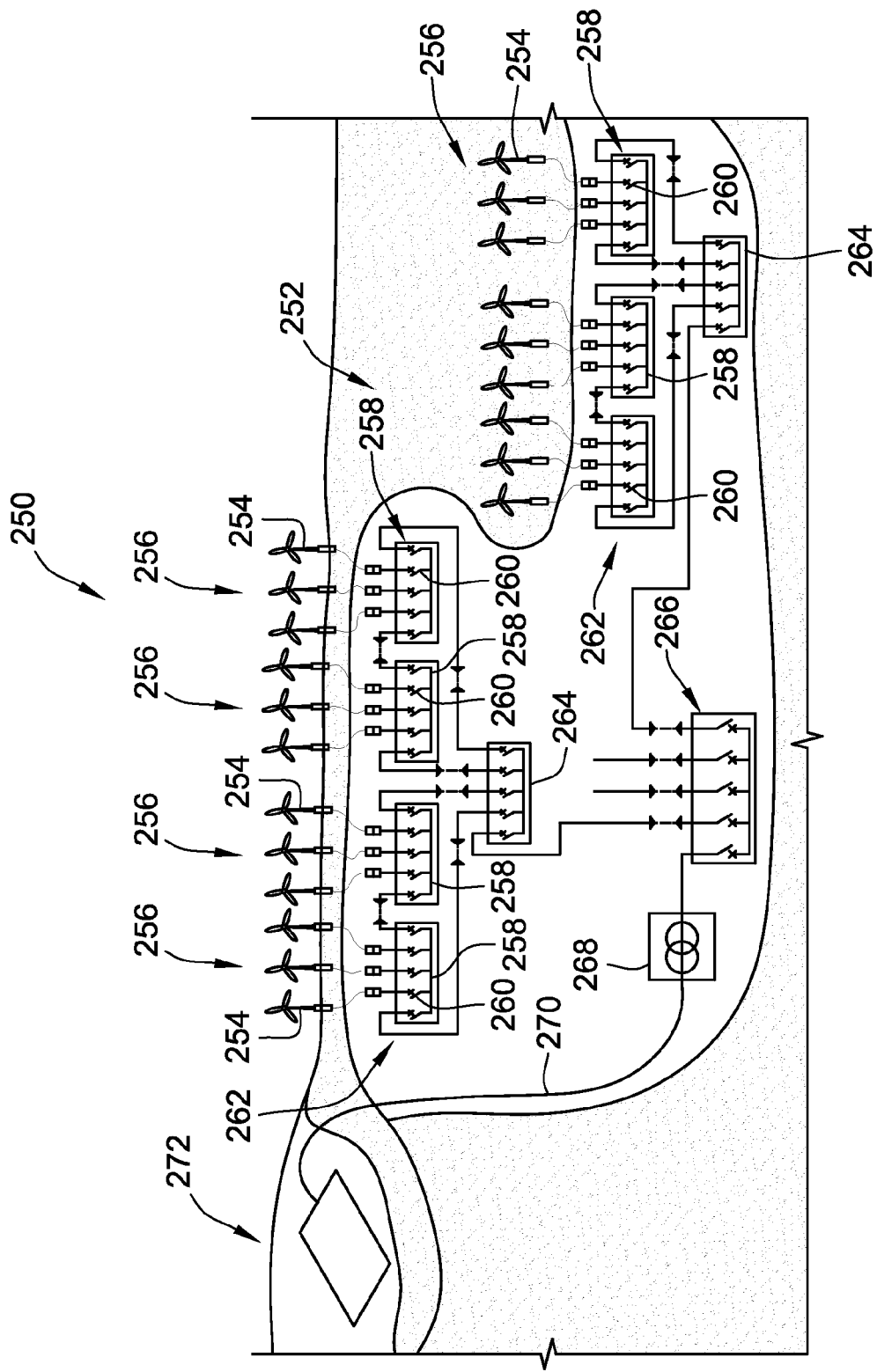
FIG. 15 is a schematic diagram of a subsea modular electrical distribution system for a sea-based wind farm, in accordance with exemplary embodiments of the present techniques.

Referring generally to FIG. 15, a wind farm 250 having a modular subsea electrical distribution network 252 is presented. In the illustrated embodiment, the wind farm 250 comprises a plurality of wind turbine-generators 254. In this embodiment, groups 256 of wind turbine-generators 254 are electrically connected to a "local" modular subsea circuit breaker assembly 258. The modular subsea circuit breaker assemblies 258 have the features and characteristics as described above in respect to FIGS. 2-14, as described above. In this embodiment, each wind turbine-generator 254 is connected to a corresponding circuit breaker 260 within a modular subsea circuit breaker assembly 258. In turn, groups 262 of modular subsea circuit breaker assemblies 258 are connected to a "regional" modular subsea circuit breaker assembly 264. The "regional" modular subsea circuit breaker assemblies 264 are connected to a "central hub" modular subsea circuit breaker assembly 266. The "central hub" modular subsea circuit breaker assembly 266 is connected to a step-up transformer 268 to increase the voltage of the power generated by the wind turbine-generators 254 to a high-voltage for transmission over a subsea umbilical 270 to a shore facility 272.

Figure 16:
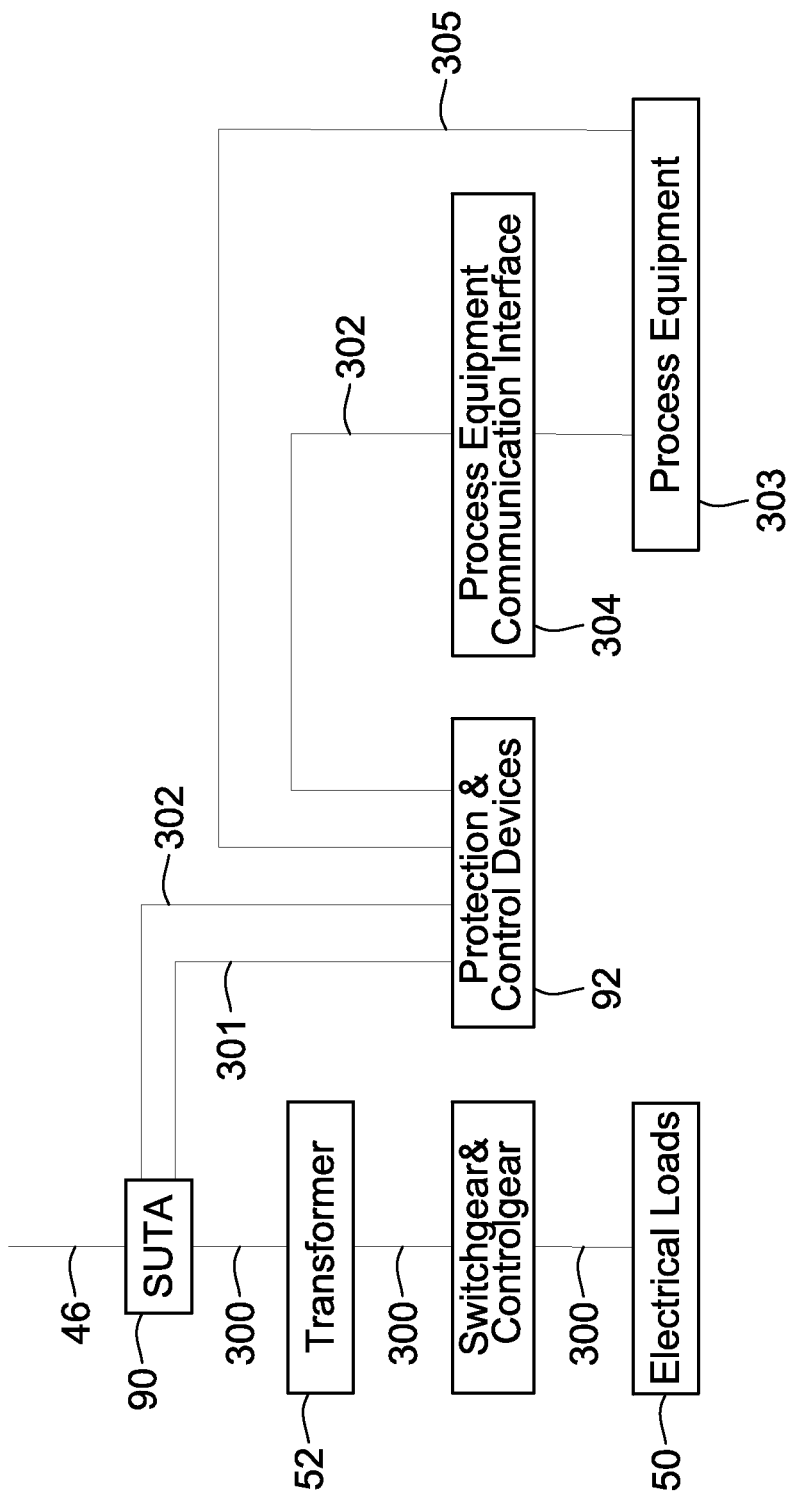
FIG. 16 is a simplified schematic diagram of the subsea electrical distribution system, in accordance with exemplary embodiments of the present techniques.

Referring generally to FIG. 16, in addition to HV AC power and communications lines, the subsea electric system 30 also couples HV DC to, and through, the subsea power distribution system 34. In this embodiment, HV DC is typically between 2 kV and 10 kV. Previously, HV DC was coupled to subsea loads in either a separate umbilical or produced subsea from HV AC transmitted subsea via an umbilical. However, in the illustrated embodiment, the first umbilical 46 is configured with HV AC power cables, HV DC power cables, and fiber optic cables for communication. At the SUTA 90, HV AC power is coupled from the umbilical 46 to provide power to loads 50 via a HV AC power cable 300. In addition, HV DC power is coupled from the umbilical 46 to a protection and control module 92 by a HV DC power cable 301. Finally, communication capability is coupled from the umbilical 46 to the protection and control module 92 by a fiber optic cable 302. Communication capability is provided to process equipment 303 from the protection and control modules 92 via a fiber optic cable 302 and a subsea communication interface 304. In addition, the protection and control module 92 provides DC auxiliary power to the process equipment via an auxiliary DC power cable 305.

Figure 17:
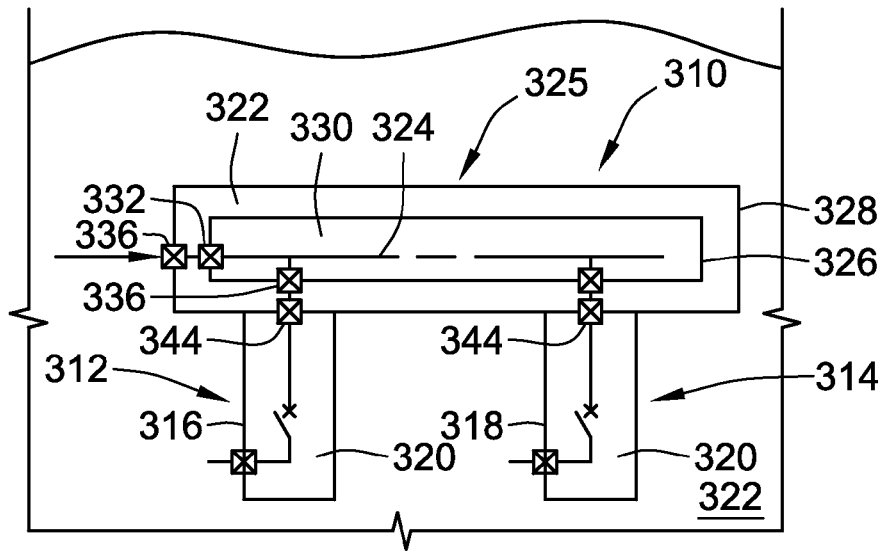
FIG. 17 is an elevation view of a prior art subsea circuit breaker and bus bar enclosure system

Referring generally to FIG. 17, a representative subsea breaker and bus bar assembly is disclosed, and represented generally by reference numeral 310. The illustrated assembly 310 has a first circuit breaker 312 and a second circuit breaker 314. The first circuit breaker 312 has an enclosure 316 and the second circuit breaker 314 has an enclosure 318. The interiors of both enclosures 316, 318 is pressurized with $SF_6$ gas 320. The pressure of the gas 320 may be near atmospheric pressure. Therefore, there will be a large differential pressure between the interior of the enclosures 316, 318 and the seawater 322 pressure surrounding the assembly 310 when the assembly 310 is located subsea. The assembly 310 also comprises a bus bar 324 housed within a two-stage pressure compensation housing 325. The bus bar 324 is housed within a first enclosure 326. The first enclosure 326, in turn, is housed within a second enclosure 328. The first enclosure 326 is filled with a first oil 330 and the second enclosure 328 is filled with a second oil 332. The viscosities of the oils 330, 332 may vary. The pressure compensation reduces, if not eliminates, the pressure differential between the interior of the first enclosure 326 and seawater 322. However, it produces a pressure differential between the oil 330 within the interior of the first enclosure 326 and the $SF_6$ gas 320 within the interior of the circuit breaker enclosures 316, 318, which may lead to leaks of oil into the interior of the circuit breaker enclosures 316, 318. In addition, this requires two sealed penetrations, a first penetration 334 and a second penetration 336, to connect to the bus bar 324, creating potential leak paths.

Figure 18:
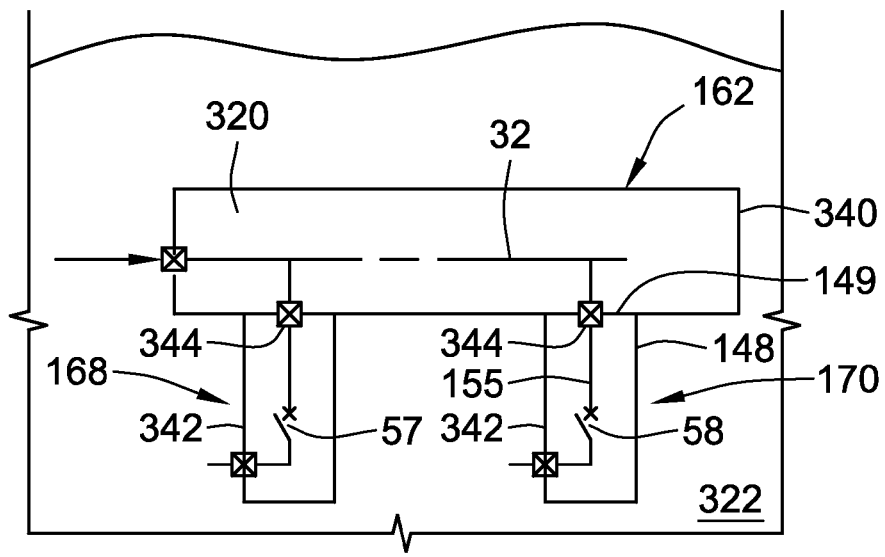
FIG. 18 is an elevation view of a modular circuit breaker assembly, in accordance with exemplary embodiments of the present techniques.

Referring generally to FIG. 18, a simplified drawing of circuit breaker module 54 of FIG. 8 is presented. In this embodiment, rather than pressure compensating the interior 338 of the bus bar assembly 162 to seawater pressure, the interior 338 of the bus bar assembly 162 is pressurized with $SF_6$ gas 320 to a pressure of two atmospheres. The $SF_6$ gas 320 is a better electrical insulator than oil 330, 332. Therefore, the interior 338 of the bus bar assembly 162 requires less volume for electrical insulation between the bus bar 62 and the enclosure 340 of the bus bar assembly 162. Thus, the size of the enclosure 340 may be reduced. In addition, the differential pressure between the gas-filled interior 338 of the bus bar assembly 162 and the gas-filled interior 342 of the circuit breakers assemblies 168, 170 is reduced, if not eliminated, reducing potential for leaks between the bus bar assembly 162 and the circuit breaker assemblies 168, 170. This also reduces the number of sealed penetrations 344 needed between the bus bar 62 and a circuit breaker 57, 58 by one, reducing potential leak paths.

Referring generally to FIG. 19, an embodiment of a penetrator 344 is presented. In this embodiment, a conductor 155 from a circuit breaker 57, 58, etc., extends through an opening 346 in the pressure barrier 149 between the interior and exterior gas or fluids at various pressure ratings. In this embodiment, the penetrator 344 comprises insulation 348 surrounding the conductor 155 and a body 350 that completes the seal against the opening 346 in the pressure barrier 149. The body 350 also comprises a boot 352. In this embodiment, the boot 352 also comprises a first current sensor 354 and a second current sensor 356 integrated into the boot 352. The current sensors 354, 356 comprise a sensor core 358, a sensor winding 360, and sensor insulation 362. The current sensors 354, 356 may be current transformers.

Figure 20:
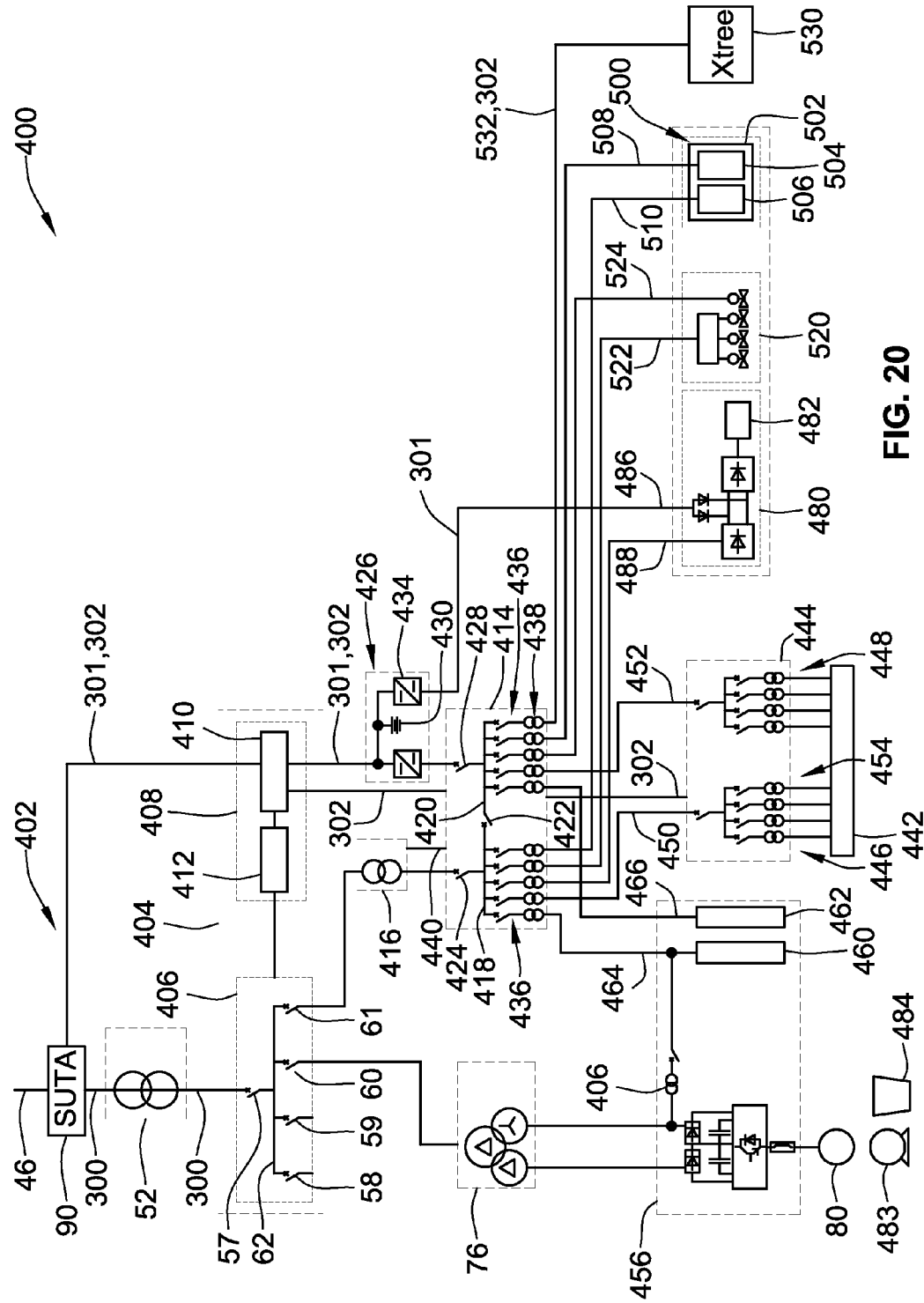
FIG. 20 is a schematic diagram of a subsea system comprising a modular subsea electrical distribution system, in accordance with an alternative embodiment of the present techniques.

Referring generally to FIG. 20, a subsea system is presented and represented generally by reference numeral 400. In this embodiment, the subsea system 400 comprises a modular subsea electrical distribution system 402 operable to provide HV AC, Low voltage alternating current ("LV AC"), HV DC, Low voltage direct current ("LV DC"), and fiber optic communication lines to power and control subsea loads.

In the illustrated embodiment, a HV AC power cable 300, a HV DC power cable 301, and a fiber optic communication line 302 are coupled to a modular HV Subsea Substation ("HVSS") 404 comprising a circuit breaker module 406 and a protection and control module 408. The HV AC power cable 300 is coupled to the subsea circuit breaker module 406. The subsea circuit breaker module 406 comprises circuit breaker assemblies 57, 58, 59, 60, 61, and a busbar assembly 62, as described above in FIG. 2. The HV DC power cable 301 and fiber optic communication line 302 are coupled to a control and monitoring module 408. In this embodiment, the control and monitoring module 408 comprises a HV DC power and fiber optic communication line interface 410. DC power and communication signals are coupled to a protection and control module 412. The protection and control module 412 is, in turn, coupled to the circuit breaker module 406. The protection and control module 412 is similar to protection and control module 92 described above in FIGS. 3-5.

In this embodiment, the subsea electrical distribution system 402 comprises a LV subsea distribution ("LVSD") module 414 operable to supply LV AC power to various loads from the HV AC power and/or the HV DC power supplied by the umbilical 46. HV AC power from the HVSS is coupled to a subsea transformer 416 via circuit breaker assembly 61. The transformer 416 steps-down the HV AC from approximately 33 kVAC to approximately 690 VAC, which is coupled to the LVSD module 414. The illustrated embodiment of the LVSD module 410 comprises a first busbar assembly 418 and a second busbar assembly 420 coupled together by a cross-connect circuit breaker assembly 422. LV AC power from the transformer 416 is coupled to the first busbar assembly 418 by a first inlet circuit breaker assembly 424. LV AC power is supplied to the second busbar assembly 420 from an uninterruptable power supply ("UPS") module 426 through a circuit breaker assembly 428 in the LVSD module 414. The UPS receives HV DC power and fiber optic communication lines from the HV DC power and fiber optic communication line interface 410. In addition, in the illustrated embodiment, the UPS module 426 comprises an emergency battery 430 operable to provide emergency DC power if power from the umbilical 46 is lost. The UPS module 426 comprises a DC to AC power supply 432 that converts DC power from either the umbilical 46, via the communication and monitoring module 408, or the emergency battery 430 to LV AC. In addition, the UPS module 426 comprises a DC to DC power supply 434 for providing DC power to loads from either umbilical, via the communication and monitoring module 408, or the emergency battery 430

The LVSD module 414 comprises a plurality of circuit breaker assemblies 436. Some of the circuit breaker assemblies are coupled to the first busbar assembly 418 and some are coupled to the second busbar assembly 420. Depending upon the position of the cross-connect circuit breaker assembly 422, power may be supplied to the circuit breaker assemblies 436 from the HVSS 404 and/or the UPS module 426. In this embodiment, the power supplied by the UPS module 426 is considered as "Secure Power" meaning that it is available when the normal AC power has failed. In this embodiment, during normal operation, the cross-connect circuit assembly 422 is open and circuit breaker assembly 428 is closed so that the circuit breaker assemblies are supplied power by the HVSS 404 and the UPS 432. However, when there is a loss of power from the UPS module 432, the cross-connect 422 is closed and circuit breaker assembly 428 is opened so that the AC power from the HVSS 404/umbilical 46 may supply power to critical loads that must remain energized. In this embodiment, each circuit breaker assembly 436 couples power to subsea loads via an isolation transformer 438. The outgoing circuits of the LVSD module 426 are provided with isolation transformers 438 in order to allow loads to continue to be supplied should an earth fault occur on the load side of the isolation transformer 438.

The monitoring and control of the devices within the LVSD module 414 is performed via fiber optic cables 302 connected to the CMM 408. In addition, sensors installed on the step-down transformer 416 are connected to the LVSD module via subsea cable 440. The LVSD module 414 converts signals from these sensors to optical signals for transmission via the fiber optic cables 302 connecting the LVSD module 414 to the CMM 408 and, thus, to other subsea equipment and the shore station.

The subsea system 400 also comprises a subsea heating system 442. The subsea electrical distribution system 402 comprises a heat tracing module ("HTM") 444 for supplying LV AC power to the heating system 442. The HTM 444 is a LV AC switchgear module dedicated to the subsea heating system 442. High power subsea heating circuits 446 used for initial heating are supplied by the HVSS 404 via a power cable 450 coupled to the first busbar 418 of the LVSD module 414. Lower power circuits 448 used for maintaining a temperature are supplied by a power cable 452 coupled to the second busbar 420 of the LVSD module 414 and, therefore, may be supplied by the UPS module 426 if power from the HVSS 404 is lost. The HTM 444 also comprises a plurality of isolation transformers 454. The isolation transformers 454 in the HTM 444 are used for two purposes. The first purpose is to allow continued operation in case of an earth fault on the load side of the transformer 454. The other purpose is to adapt the output voltage to that required by the heating system 442. For example, the heating system 442 may require voltages of greater than 1000 V AC. This second purpose may be a new idea for a subsea heating power supply. The LVSD module 414 also communicates with the HTM 442 via fiber optic cables 302. This allows the HTM 444 to be monitored and remotely controlled in the same manner as the LVSD module 414. Similarly any sensors in the heating system 442 can be connected to devices within the HTM 444 and converted to optical signals for transmission to other subsea equipment or to the shore station.

LV AC also is supplied to a VFD assembly 456 in this embodiment. The VFD assembly 456 receives main HV AC power form the HVSS 404. In the illustrated embodiment, LV AC from the first busbar 418 of the LVSD module 414 is provided to the VFD assembly 456 to power a pre-charge and pre-magnetization transformer 458 located within the VFD assembly 456. This transformer 458 must be energized before main AC power from the HVSS is energized. In previous subsea VFD systems, power to a pre-charge and pre-magnetization transformer of a VFD was provided from a subsea or topside UPS. In this embodiment, only normal AC power is required, not secure power. LV AC power from the HVSS 404 via the first busbar 418 is provided to secondary functions 460. Secure power from the second busbar 420 is provided to primary functions 462, such as the control electronics of the VFD and for cooling fans, if provided. A power cable 464 is provided to couple LV AC power from the first busbar 418 to the secondary functions and a separate power cable 466 is provided to couple secure LV AC power from the second busbar 420 to the main functions 462.

The subsea system 400 also comprises a magnetic bearing module ("MBM") 480, which supplies power to a magnetic bearing 482 for a rotating device. The VFD 456 is used to power an electric motor 80, which, in turn, may be used to drive a number of different rotating devices, such as a subsea pump 483 or subsea compressor 484. The subsea pump 483 may be used to pump production fluids from a subsea well to a platform, vessel, or shore facility. The subsea compressor 484 may be used to compress production gases from a subsea well, which may be piped to a platform, vessel, or shore facility. The magnetic bearing 482 provides support for the rotating shafts of the rotating devices powered by the VFD 456. In this embodiment, the MBM 480 may receive DC power from the UPS module 426 or LV AC from the LVSD module 414. A DC power cable 486 couples DC power from the UPS module 426 to the MBM 480. An AC power cable 488 couples AC power from the LVSD module 414 to the MBM 480.

In the illustrated embodiment, the subsea system 400 comprises a subsea control module ("SCM") 500. The SCM 500 controls the subsea production and processing equipment. In this embodiment, the SCM 500 comprises a subsea electrical module ("SEM") 502. In previous designs, the SCM 500 and its embodied SEM 502 received power directly from a shore facility via a separate power cable. In this embodiment, main function controller 504 of the SEM 502 receives secure power from the second busbar 420 of the LVSD module 414. Secondary function controller 506 receives power from the first busbar 418 of the LVSD module 414. As noted above, secure power from the second busbar 420 of the LVSD module 414 may be LV AC power stepped-down from the HV AC power of the umbilical 46 or AC power converted either from the HV DC power in the umbilical 46 or emergency battery 430 in the UPS module 426. A power cable 510 is provided to couple LV AC power from the first busbar 418 to the secondary function controller 506 and a separate power cable 512 is provided to couple secure LV AC power from the second busbar 420 to the main function controller 504.

In addition, the subsea electrical distribution system 402 provides power to motor-operated valves and actuators, represented generally by reference numeral 520. One or more of the motor-operated valves and actuators 520 may be powered by LV AC from the first busbar 418 of the HVSS 414. In addition, one or more of the motor-operated valves and actuators 520 may be powered by secure power from the second busbar 420 of the LVSD module 414. Secure power may be LV AC power stepped-down from the HV AC power of the umbilical 46 or AC power converted either from the HV DC power in the umbilical 46 or emergency battery 430 in the UPS module 426. A power cable 522 is provided to couple LV AC power from the first busbar 418 to the motor-operated valves and actuators 520 and a separate power cable 524 is provided to couple secure LV AC power from the second busbar 420 to the motor-operated valves and actuators 520.

In addition, in this embodiment, the subsea electrical distribution system 402 provides power to a subsea tree 530 via a power cable 532. The subsea tree 530 monitors and controls the production of fluids from a subsea well. The subsea tree 530 is secured to a subsea wellhead (not shown) of a completed subsea well. The subsea tree 530 has valves that control the flow of fluids flowing from the subsea well or gas or water injected into the subsea well. In this embodiment, the valves controlling flow to, from, and through the subsea tree 530 are operated using electric operators powered from the power cable 532 of the subsea electrical distribution system 402. However, the electric operators may be powered with DC power from the DC module 426. In addition, a fiber optic cable 302 is routed to the subsea tree 530 to enable the subsea tree 530 to be controlled from the surface.

Figure 21:
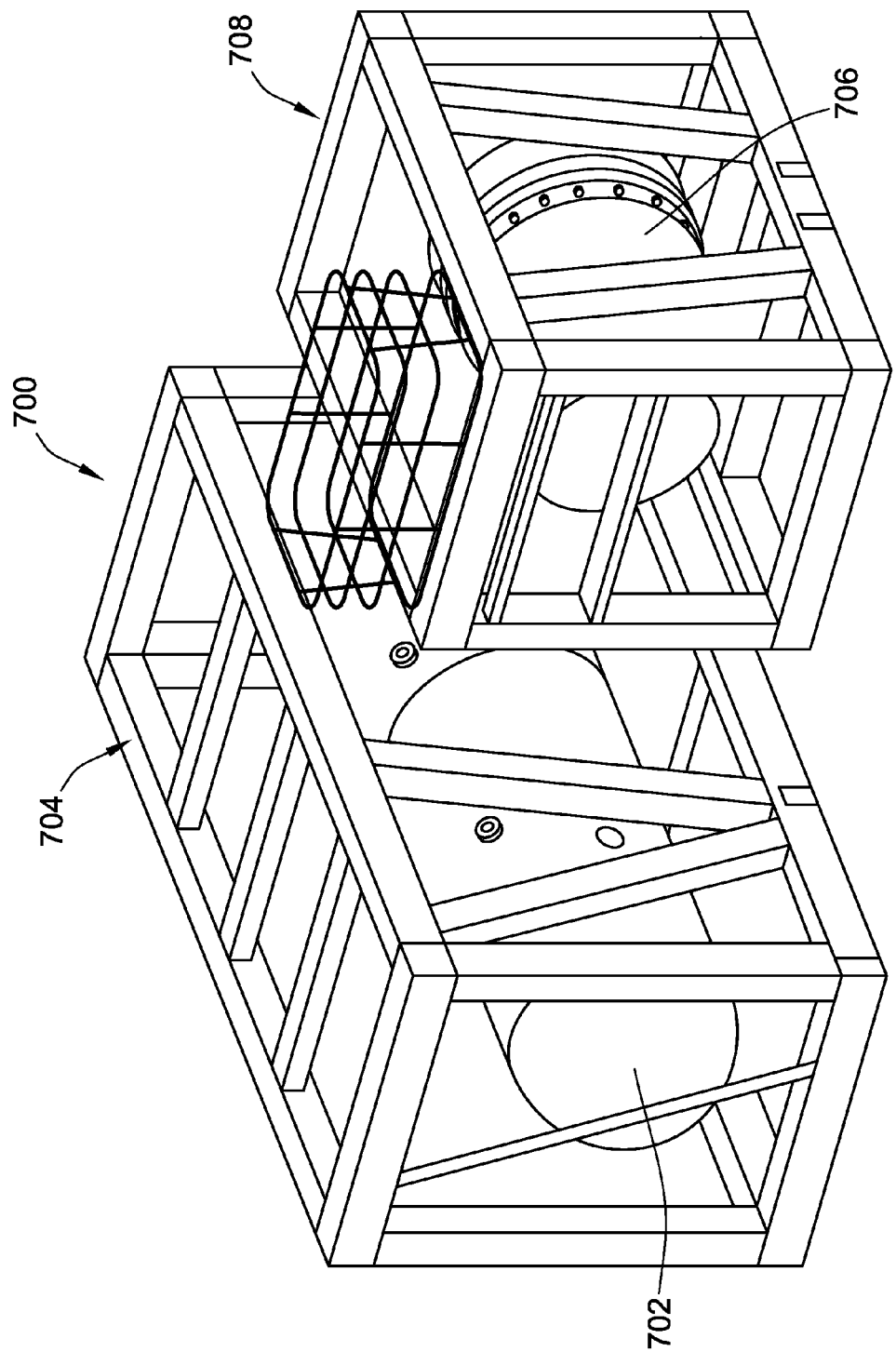
FIG. 21 is a perspective view of a modular subsea circuit breaker assembly, in accordance with an exemplary embodiment of the present techniques.

Referring generally to FIG. 21, an embodiment of a modular subsea circuit breaker assembly for use with the subsea electrical distribution system described above is presented and represented generally by reference numeral 700. In this embodiment, a subsea circuit breaker assembly 702, such as one of the circuit breaker assemblies 54, 56, 64, 66, 68, 70 of FIG. 2, is supported by a frame 704. In addition, a protection and control module 706, such as protection and control module 92 of FIG. 3, is supported by a frame 708. The protection and control module 706 may be connected to the circuit breaker assembly 702 by disposing the protection and control module 706 and frame 708 proximate to the circuit breaker assembly 702 and frame 704 and connecting cables between the protection and control module 706 and the circuit breaker assembly 702. Either the protection and control module 706 or circuit breaker assembly 702 may be replaced by disconnecting the cables connecting them together and lifting the device to be replaced to the surface. A replacement device may be lowered to the position of the original device and the electrical cable re-connected. Subsea cables and flying leads are connected and disconnected by means of an ROV (not shown).

Referring generally to FIG. 22, an alternative embodiment of a modular subsea electrical distribution system 800 is presented. As above, the busbar assembly 800 comprises a busbar 802 housed within a sealed housing 804. Also as above, the housing 804 is pressurized with $SF_6$ gas. However, in this embodiment, an input electrical power cable 806 is connected directly to the busbar 802, rather than to a supply-side circuit breaker, such as circuit breaker 57 in FIG. 2. The cable 806 extends through a sealed penetration 808 in the housing 804. The end of the cable 806 opposite the busbar 802 is connected to an electrical connector 810. Circuit breaker assemblies may be connected to the busbar 802 to couple power from the busbar 802 to electrical loads. Alternatively, additional electrical cables 806 may be connected directly to the busbar 802 and routed to supply electrical loads. The busbar housing 804, cable 806, cable electrical connector 810, etc., are supported by a frame 812.

As noted above, one or more specific embodiments of the present invention were provided above. In an effort to provide a concise description of these embodiments, not all features of an actual implementation were described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill in the art and having the benefit of this disclosure.

What is claimed is:

1. A subsea electrical distribution system, comprising:
a first subsea circuit breaker electrically coupleable to a first electrical load;
a second subsea circuit breaker electrically coupleable to a second electrical load;
a first subsea circuit breaker control system having a first control circuit coupled to the first subsea circuit breaker and a second control circuit coupled to the second subsea circuit breaker, the first subsea circuit breaker control system being removable from the subsea electrical distribution system; and
a second subsea circuit breaker control system having a third control circuit coupled to the first subsea circuit breaker and a fourth control circuit coupled to the second subsea circuit breaker, the second subsea circuit breaker control system being removable from the subsea electrical distribution system,
wherein each of the first subsea circuit breaker control system and the second subsea circuit breaker control system are operable to open and close the first subsea circuit breaker and the second subsea circuit breaker to enable power to be provided to the first electrical load and the second electrical load when one of the first subsea circuit breaker control system and the second subsea circuit breaker control system is removed from the subsea electrical distribution system.

2. The subsea electrical distribution system of claim 1, wherein the first subsea circuit breaker comprises a first closing coil and a second closing coil and the second subsea circuit breaker comprises a third closing coil and a fourth closing coil.

3. The subsea electrical distribution system of claim 2, wherein the first subsea circuit breaker is configured to close from an open condition when at least one of the first closing coil and the second closing coil is energized and the second subsea circuit breaker is configured to close when at least one of the third closing coil and the fourth closing coil is energized.

4. The subsea electrical distribution system of claim 3, wherein the first control circuit is coupled to the first closing coil and the fourth closing coil and the second control circuit is coupled to the second closing coil and third closing coil.

5. The subsea electrical distribution system of claim 1, comprising a busbar enclosure housing a busbar, wherein the first subsea circuit breaker is disposed within a first enclosure secured to the busbar enclosure and the second subsea circuit breaker is disposed within a second enclosure secured to the busbar enclosure, the first and second circuit breakers being electrically coupled to the busbar.

6. The subsea electrical distribution system of claim 5, wherein the first subsea circuit breaker comprises a first trip coil and a second trip coil and the second subsea circuit breaker comprises a third trip coil and a fourth trip coil.

7. The subsea electrical distribution system of claim 6, wherein the first subsea circuit breaker is configured to open from a closed condition when at least one of the first trip coil and the second trip coil is energized and the second subsea circuit breaker is configured to open from a closed condition when at least one of the third trip coil and the fourth trip coil is energized.

8. The subsea electrical distribution system of claim 7, wherein the first control circuit is coupled to the first trip coil and the second control circuit is coupled to the fourth trip coil.

9. The subsea electrical distribution system of claim 7, comprising a first current sensor coupled to the first subsea circuit breaker control system, the first current sensor being operable to sense current flowing through the first circuit breaker and provide a signal representative thereof, wherein the first subsea circuit breaker control system is configured to energize the first trip coil based on the signal representative of current flowing through the first circuit breaker.

10. The subsea electrical distribution system of claim 1, wherein the first circuit breaker comprises:
a spring-charged mechanism for operating the circuit breaker;
a first motor operable to charge the spring-charged mechanism; and
a second motor operable to charge the spring-charged mechanism.

11. The subsea electrical distribution system of claim 10, wherein the first motor and second motor receive power to charge the spring-charged mechanism from independent power sources.

12. The subsea electrical distribution system of claim 10, wherein the first motor receives power to charge the spring-charged mechanism from the first control circuit and the second motor receives power to charge the spring-charged mechanism from the second control circuit.

13. A method of providing redundant control of a plurality of subsea circuit breakers of a subsea electrical distribution system, comprising:
providing a first subsea circuit breaker with a first tripping coil and a second tripping coil, wherein the first subsea circuit breaker is opened from a closed condition when at least one of the first tripping coil and second tripping coil is energized;
providing a second subsea circuit breaker with a third tripping coil and a fourth tripping coil, wherein the second subsea circuit breaker is opened from a closed condition when at least one of the third tripping coil and fourth tripping coil is energized;
providing a first subsea circuit breaker control system operable to control energization of the first tripping coil and the fourth tripping coil, the first subsea circuit breaker control system being removable from the subsea electrical distribution system;
providing a second subsea circuit breaker control system operable to control energization of the second tripping coil and the third tripping coil, the second subsea circuit breaker control being removable from the subsea electrical distribution system;
coupling the first subsea circuit breaker control system and the second subsea circuit breaker control systems to the first subsea circuit breaker and the second subsea circuit breaker,
controlling the first subsea circuit breaker with the second subsea circuit breaker control system if the first subsea circuit breaker control system is removed from the subsea electrical distribution system; and
controlling the second subsea circuit breaker with the first subsea circuit breaker control system if the second subsea circuit breaker control system is removed from the subsea electrical distribution system.

14. The method as recited in claim 13, comprising:
providing the first subsea circuit breaker with at least one current sensor operable to produce a signal representative of current flowing through the first subsea circuit breaker; and
coupling the at least one current sensor to the first subsea circuit breaker control system and the second subsea circuit breaker control system, wherein the first subsea circuit breaker control system and second subsea circuit breaker control system are configured to direct energization of the first tripping coil and second tripping coil, respectively, when current flow through the first subsea circuit breaker exceeds a desired amount.

15. The method as recited in claim 13, comprising:
providing the first subsea circuit breaker with a first closing coil and a second closing coil, wherein the first subsea circuit breaker is closed from an open condition when at least one of the first closing coil and second closing coil is energized;
providing a second subsea circuit breaker with a third closing coil and a fourth closing coil, wherein the second subsea circuit breaker is closed from an open condition when at least one of the third closing coil and fourth closing coil is energized.

16. The method as recited in claim 15, comprising:
coupling the first and second subsea circuit breaker control systems to the surface via a fiber optic communication line; and
energizing at least one of the first, second, third, and fourth closing coils based on communications received via the fiber optic communication line.

17. The method as recited in claim 14, comprising:
disconnecting the first subsea circuit breaker control system from the subsea electrical distribution system, and
connecting a replacement for the first subsea circuit breaker control system to the subsea electrical distribution system.

18. A subsea electrical distribution system, comprising:
a first subsea circuit breaker;
a second subsea circuit breaker;
a first subsea circuit breaker control system having a first control circuit coupled to the first subsea circuit breaker and a second control circuit coupled to the second subsea circuit breaker, the first subsea circuit breaker control system being removable from the subsea electrical distribution system; and
a second subsea circuit breaker control system having a third control circuit coupled to the first subsea circuit breaker and a fourth control circuit coupled to the second subsea circuit breaker, the second subsea circuit breaker control system being removable from the subsea electrical distribution system,
wherein each of the first subsea circuit breaker control system and the second subsea circuit breaker control system are operable to open and close the first subsea circuit breaker and the second subsea circuit breaker to enable the first subsea circuit breaker and the second subsea circuit breaker to operate when one of the first subsea circuit breaker control system and the second subsea circuit breaker control system is removed from the subsea electrical distribution system.

* * * * *